United States Patent
Banin et al.

(10) Patent No.: US 9,754,802 B2
(45) Date of Patent: Sep. 5, 2017

(54) THERMAL DOPING BY VACANCY FORMATION IN NANOCRYSTALS

(71) Applicant: YISSUM RESEARCH DEVELOPMENT COMPANY OF THE HEBREW UNIVERSITY OF JERUSALEM LTD., Jerusalem (IL)

(72) Inventors: Uri Banin, Mevasseret Zion (IL); Kathy Vinokurov, Jerusalem (IL); Oded Millo, Jerusalem (IL); Yehonadav Bekenstein, Jerusalem (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 0 days.

(21) Appl. No.: 14/903,128

(22) PCT Filed: Jul. 10, 2014

(86) PCT No.: PCT/IL2014/050621
§ 371 (c)(1),
(2) Date: Jan. 6, 2016

(87) PCT Pub. No.: WO2015/004666
PCT Pub. Date: Jan. 15, 2015

(65) Prior Publication Data
US 2016/0133481 A1 May 12, 2016

Related U.S. Application Data

(60) Provisional application No. 61/845,135, filed on Jul. 11, 2013.

(51) Int. Cl.
*H01L 21/477* (2006.01)
*H01L 29/06* (2006.01)
(Continued)

(52) U.S. Cl.
CPC ............ *H01L 21/477* (2013.01); *B82Y 10/00* (2013.01); *B82Y 40/00* (2013.01);
(Continued)

(58) Field of Classification Search
CPC ... H01L 21/477; H01L 29/0665; H01L 29/22; H01L 29/227
See application file for complete search history.

(56) References Cited

U.S. PATENT DOCUMENTS

| 7,768,042 B2 | 8/2010 | Park et al. |
| 2009/0183994 A1 | 7/2009 | Misra et al. |
| 2011/0159680 A1* | 6/2011 | Yoo ........................ C23C 16/403 438/591 |

FOREIGN PATENT DOCUMENTS

WO    2014/080367 A1    5/2014

OTHER PUBLICATIONS

Zhang, S. et al. "Defect Physics of the CuInSe2 Chalcopyrite Semiconductor". Physical Review B, vol. 57 (16), p. 9642-9656, 1998.
(Continued)

*Primary Examiner* — Phat X Cao
(74) *Attorney, Agent, or Firm* — Oliff PLC

(57) ABSTRACT

The invention generally relates to methods of thermal doping by vacancy formation in nanocrystals, devices and uses thereof.

16 Claims, 13 Drawing Sheets

(51) Int. Cl.
| | |
|---|---|
| H01L 29/24 | (2006.01) |
| B82Y 10/00 | (2011.01) |
| B82Y 40/00 | (2011.01) |
| H01L 29/22 | (2006.01) |
| H01L 29/227 | (2006.01) |

(52) U.S. Cl.
CPC .......... *H01L 29/0665* (2013.01); *H01L 29/22* (2013.01); *H01L 29/227* (2013.01); *H01L 29/242* (2013.01); *Y10S 977/773* (2013.01); *Y10S 977/90* (2013.01)

(56) References Cited

OTHER PUBLICATIONS

Luther, Joseph et al. "Localized Surface Plasmon Resonances Arising From Free Carriers in Doped Quantum Dots". Nature Materials, vol. 10, p. 361-366, 2011.
Deka, Sasanka et al. "Phosphine-Free Synthesis of p-Type Copper(I) Selenide Nanocrystals in Hot Coordinating Solvents". Journal of the American Chemical Society, vol. 132(26), p. 8912-8914, 2010.
Rivest, Jessy et al. "Size Dependence of a Temperature-Induced Solid-Solid Phase Transition in Copper(I) Sulfide". The Journal of Physical Chemistry Letters, vol. 2, p. 2402-2406, 2011.
Zheng, Haimei et al. "Observation of Transient Structural-Transformation Dynamics in a Cu2S Nanorod". Science, vol. 333, p. 206-209. 2011.
Drndic, M. et al. "Transport Properties of Annealed CdSe Colloidal Nanocrystal Solids". Journal of Applied Physics, vol. 92(12), p. 7498-7503, 2002.
Mentzel, T. et al. "Charge Transport in PbSe Nanocrystal Arrays". Physical Review B, vol. 77, p. 075316.1-075316.8, 2008.
Hu, Zonghai et al. "Local Charge Transport in Two-Dimensional PbSe Nanocrystal Arrays Studied by Electrostatic Force Microscopy". Nano Letters, vol. 5(7), p. 1463-1468, 2005.
Porter, Venda et al. "Photoconduction in Annealed and Chemically Treated CdSe/ZnS Inorganic Nanocystal Films". Journal of Physical Chemistry, vol. 112(7), p. 2308-2316, 2008.
Fischbein, M. et al. "CdSe Nanocrystal Quantum-Dot Memory". Applied Physics Letters, vol. 86, p. 193106.1-193106.3, 2005.
Lifshitz, E. et al. "Air-Stable PbSe/PbS and PbSe/PbSexS1-x Core-Shell Nanocrystal Quantum Dots and Their Applications". Journal of Physical Chemistry, vol. 110(50), p. 25356-25365, 2006.
Law, Matt et al. "Structural, Optical, and Electrical Properties of PbSe Nanocrystal Solids Treated Thermally or With Simple Amines". Journal of the American Chemical Society, vol. 130(18), p. 5974-5985, 2008.
Scotognella, Francesco et al. "Plasmon Dynamics in Colloidal Cu2-xSe Nanocrystals". Nano Letters, vol. 11, p. 4711-4717, 2011.
Evers, Wiel et al. "Low-Dimensional Semiconductor Superlattices Formed by Geometric Control Over Nanocrystal Attachment". Nano Letters, vol. 13, p. 2317-2323, 2012.
Liu, H. et al. "The Enhancement of TiO2 Photocatalytic Activity by Hydrogen Thermal Treatment". Chemosphere, vol. 50, p. 39-46, 2003.
Mochizuki, D. et al. "Pattern Doping on CdTe by Excimer Laser Irradiation". Journal of Crystal Growth, vol. 214/215, p. 520-523, 2000.
Bekenstein, Y. et al. "Thermal Doping by Vacancy Formation in Copper Sulfide Nanocrystal Arrays". Nano Letters, vol. 14, p. 1349-1353, 2014.
Miszta, Karol et al. "Hollow and Concave Nanoparticles Via Preferential Oxidation of the Core in Colloidal Core/Shell Nanocrystals". Journal of the American Chemical Society, vol. 136, p. 9061-9069, 2014.
Jain, Prashant et al. "Doped Nanocrystals As Plasmonic Probes of Redox Chemistry". Angewandte Chemie International Edition, vol. 52, p. 13671-13675, 2013.
Niezgoda, J. et al. "Plasmonic CuxInyS2 Quantum Dots Make Better Photovoltaics Than Their Nonplasmonic Counterparts". Nano Letters, vol. 14, p. 3262-3269, 2014.
Arita, Minoru. "Thermodynamics and Defect Structures of Silver Sulfide". Journal of Physics and Chemistry of Solids, vol. 68, p. 1730-1744, 2007.
Sands, T. et al. "High Resolution Ovservations of Copper Vacancy Ordering in Chalcocite (Cu2S) and the Transformation of Djurleite (Cu1.97 to 1.94S)". Physica Status Solidi, vol. 72, p. 551-559, 1982.
Grozdanov, Ivan. "Optical and Electrical Properties of Copper Sulfide Films of Variable Composition". Journal of Solid State Chemistry, vol. 114, p. 469-475, 1995.
Lee, Jong-Soo et al. "Band-Like Transport, High Electron Mobility and High Photoconductivity in All-Inorganic Nanocrystal Arrays". Nature Nanotechnology, vol. 6, p. 348-352, 2011.
Han, Wei et al. "Synthesis and Shape-Tailoring of Copper Sulfide/Indium Sulfide-Based Nanocrystals". Journal of the American Chemical Society, vol. 130(39), p. 13152-13161, 2008.

\* cited by examiner

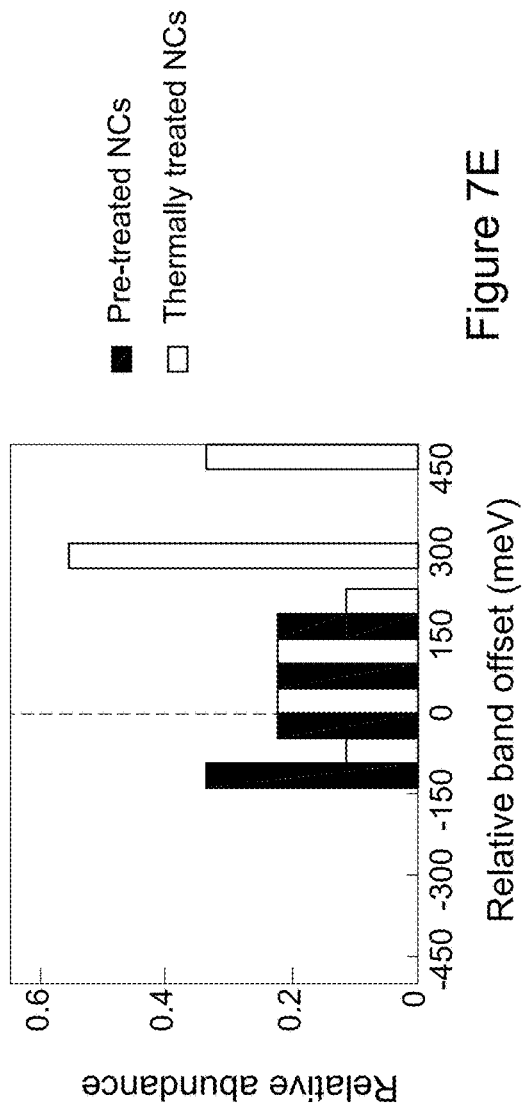
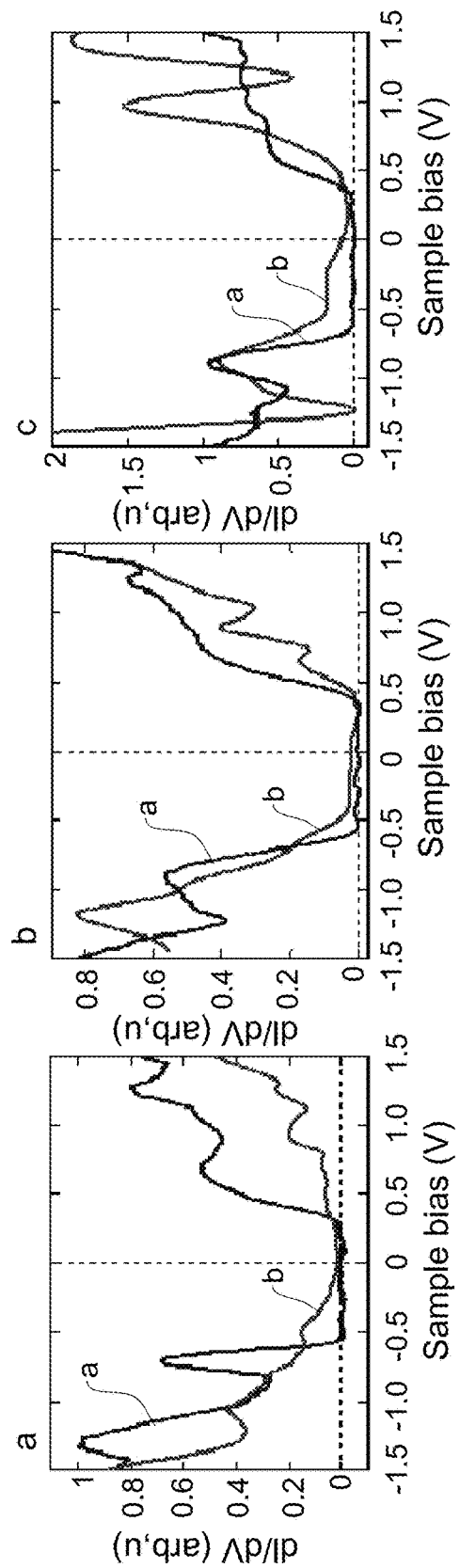
Figure 7E
Figure 7F

THERMAL DOPING BY VACANCY FORMATION IN NANOCRYSTALS

FIELD OF THE INVENTION

The invention generally relates to methods of thermal doping by vacancy formation in nanocrystals.

BACKGROUND

Semiconductor nanocrystals (NC) films manifest size-dependent tunable properties and can be deposited on a variety of substrates by facile wet-chemical methods. Therefore these materials have a high potential to serve as prospective materials in diverse application fields including transistor devices, functional circuits, sensors, photovoltaics and light emitting devices.

These applications require tuning of the electrical properties of the NC film to achieve efficient charge transport, along with patterning capabilities to construct functional circuits. Commonly, in bulk semiconductors lithographically patterned doping is ubiquitously used to fabricate complex microelectronic circuitry. In the case of semiconductor NC films, such control is still lacking. There is still a gap in methods of effective aliovalent doping of NCs.

Standard semiconductor doping methods have proven problematic to use with nanocrystals since the introduction of impurity atoms into NCs containing a few thousands atoms may lead to their expulsion to the surface via a "self purification" mechanism. Nevertheless, due to the central role doping can play in controlling the electronic properties, ongoing efforts have been reported for doping of semiconductor NCs.

For example, a first approach was to introduce excess charge carrier into the NCs via chemically altering their surfaces, realizing so called "remote doping". This is achievable through the use of suitable electron donating ligands binding on the nanoparticle surfaces or through electrochemical carrier injection where both may generate semiconductor NCs with n-type doping characteristics.

Such a method, as well as many others, fall under either interstitial or substitutional impurities and require tailoring the electronic properties of an impurity material to that of the NC.

Defect formation in thin films of chalcogenides and chalcopyrites have been studied with estimations of the vacancy formation energies for bulk materials [1], but may present quite different values in their NC form.

Luther, J. M. et al. reported that an oxidation by oxygen exposure in ambient conditions of $Cu_2S$ NCs led to observation of a plasmon band assigned to free carries induced by copper vacancies [2,3].

Copper vacancies in various Cu-chalcogenides were shown to exhibit tunable optical properties, such as plasmons [2,3]. In addition to spherical NCs, different geometries of metal chalcogenides may influence vacancy formation criteria and the resulting properties. For example $Cu_2S$ nanorods have shown to present different onset temperatures for crystallographic transitions, with variations in the nanorod's width [4]. The electrical properties of $Cu_2S$ nanorods have not been studied yet. However, the formation of vacancies and crystallographic transitions were observed [5]. Along these lines additional $Cu_2S$ shapes (tetrapods etc.) might also respond differently to the thermal doping process.

These low cost materials in their thin film morphologies were investigated intensively as prospects materials for photovoltaic applications, due to their band gap values (1.1-1.3 eV) and lack of toxic Cd content.

The conductance mechanism in NC arrays is strongly dependent on tunneling between adjacent NC through the insulating ligands the serve as a tunneling barrier. The tunneling process is exponentially sensitive to the distance between the NCs. Therefore, any reduction in this distance will also increase dramatically the conductance of the array. This can be achieved via annealing and removal of the organic protecting layer. This process referred to as annealing, is conducted at typical temperatures of 200-300° C. and is the standard method for enhancing conductance of NC devices by a few orders of magnitude ($10^3$-$10^6$) [6-13]. Although annealing is conducted at high temperatures most works ignore any induced changes to the NC's stoichiometry and defect formation and concentrate on the ligands layer by studying the changes in distance between NCs with small angle x-ray scattering (SAXS) and typical features of the ligand layer absorbance with optical spectroscopy.

REFERENCES

[1] Zhang, S.; Wei, S.-H.; Zunger, A.; Katayama-Yoshida, H. Phys. Rev. B 57, 9642-9656 (1998).
[2] Luther, J. M., Jain, P. K., Ewers, T. & Alivisatos, A. P. Localized surface plasmon resonances arising from free carriers in doped quantum dots. Nature Materials 10, 361-366 (2011).
[3] Deka, S.; Genovese, A.; Zhang, Y.; Miszta, K.; Bertoni, G.; Krahne, R.; Giannini, C.; Manna, L. J. Am. Chem. Soc., 132, 8912-8914 (2010).
[4] Rivest, J.; Fong, L. K.; Jain, P. J.; Toney F. M.; Alivisatos A. P., J. Phys. Che. Lett., 2, 2402-2406 (2011).
[5] Zheng H.; Rivest J. B.; Miller T. A.; Sadtler B.; Lindenberg A.; Toney M. F.; Wang L. W.; Kisielowski C; Alivisatos A. P., Science, 333, 206 (2011).
[6] Drndić, M.; Jarosz, M. V.; Morgan, N. Y.; Kastner, M. a.; Bawendi, M. G. J. Appl. Phys., 92, 7498 (2002).
[7] Mentzel, T.; Porter, V.; Geyer, S.; MacLean, K.; Bawendi, M.; Kastner, M. Phys. Rev. B, 77, 075316 (2008).
[8] Hu, Z.; Fischbein, M. D.; Drndić, M. Nano Lett. 2005, 5, 1463-1468.
[9] Porter, V. J.; Geyer, S.; Halpert, J. E.; Kastner, M. a.; Bawendi, M. G. J. Phys. Chem. C, 112, 2308-2316 (2008).
[10] Fischbein, M. D.; Drndic, M. Appl. Phys. Lett. 2005, 86, 193106.
[11] Lifshitz, E.; Brumer, M.; Kigel, A.; Sashchiuk, A.; Bashouti, M.; Sirota, M.; Galun, E.; Burshtein, Z.; Le Quang, A. Q.; Ledoux-Rak, I.; Zyss, J. J. Phys. Chem. B, 110, 25356-25365 (2006).
[12] Law, M.; Luther, J. M.; Song, Q.; Hughes, B. K.; Perkins, C. L.; Nozik, A. J. J. Am. Chem. Soc., 130, 5974-5985 (2008).
[13] Scotognella, F.; Della Valle, G.; Srimath Kandada, A. R.; Dorfs, D.; Zavelani-Rossi, M.; Conforti, M.; Miszta, K.; Comin, A.; Korobchevskaya, K.; Lanzani, G.; Manna, L.; Tassone, F. Nano Lett., 11, 4711-7 (2011).
[14] Law, M. et al. Structural, optical, and electrical properties of PbSe nanocrystal solids treated thermally or with simple amines Journal of the American Chemical Society 130, 5974-85 (2008).
[15] Evers, W. H. et al. Low-Dimensional Semiconductor Superlattices Formed by Geometric Control over Nanocrystal Attachment. Nano letters (2012).

SUMMARY OF THE INVENTION

The inventors of the invention disclosed herein have developed a novel approach to thermal-doping of nanocrystals (NCs; used interchangeably with nanoparticles) for introducing vacancies into said NCs and NC films and arrays, and present methods to achieve such doped systems.

The approach of the present invention, termed herein "thermal doping", or "vacancy doping", embodies the use of low to moderate temperatures to achieve desired doping characteristics. The thermal treatment at such low to moderate temperatures induces the creation of atomic lattice vacancies within the NCs in the film, array or superlattice, thereby leading to vacancy doping. The thermal treatment at the moderate temperatures, which benefits from low thermal budget processes, may find particular and significant usefulness in thermal-sensitive products (applications), such as plastic electronics. Moreover, the modest temperature used herein allows for patterned doping via local heating induced by focused laser irradiation.

In accordance with methods of the invention, no impurities are introduced to the NCs, rather the opposite process takes place; namely, the expulsion of atoms from the intrinsic material.

In contrast to methodologies of the art, as explained herein, the methods of the invention do not require high temperature thermal annealing of the NCs in order to achieve conductance. As may be noted in the present invention, the thermal doping method of the invention permits an exceptional increase of conductance in several degrees of magnitude. In some cases, a conductance increase of 6 orders of magnitude was observed when the method of the invention was employed for thermal doping of nanoparticles.

As thermal doping may be applied to a variety of materials such as metals, insulators and semiconductor materials, the modification of one or more electrical properties of the material may be achieved.

The thermal doping as well as the modulation of the electronic (or optical), properties (such as conductance), as further demonstrated herein, are irreversible.

Thus, in one aspect of the invention, there is provided a method for amplification or attenuation of at least one electrical or optical property of a nanoparticle material, the method comprising thermally treating said nanoparticle material under conditions permitting formation of vacancies within the nanoparticle material, without substantially inducing thermal annealing of said nanoparticles or array thereof. In some embodiments, the conditions avoid thermal annealing of said nanoparticles.

The electrical properties amplified or attenuated by the method of the invention encompass, e.g., charge, conductance, impedance, resistance, voltage, current, potential, polarization of said nanoparticle material and/or nanoparticles array. In some embodiments, the amplified or attenuated electrical property is conductance of said nanoparticle material and/or nanoparticles array.

In some embodiments, the electrical property (e.g., conductance) is amplified or attenuated by increasing or reducing, respectively, said electrical property by a factor of or more than a factor of 0.25 or 0.5 or 0.75 or 1 or 1.5 or 2 or 2.5 or 3 or 3.5 or 4 or 4.5 or 5 or 6 or 7 or 8 or 9 or 10. In some embodiments, the electrical property (e.g., conductance) is amplified or attenuated by increasing or reducing, respectively, said electrical property by a factor of or more than a factor of 0.25 or 0.5 or 0.75 or 1 or 1.5 or 2 or 2.5 or 3 or 3.5 or 4 or 4.5 or 5 or 6 or 7 or 8 or 9 or 10 orders of magnitude.

In another aspect, the invention provides a method for thermal doping of a nanoparticle material, the method comprising thermally treating a nanoparticle material, as defined herein, under conditions permitting formation of vacancies within the nanoparticle material, without substantially inducing thermal annealing of said nanoparticles or array thereof. In some embodiments, the conditions avoid thermal annealing of said nanoparticles.

The method of thermal doping may be employed for producing a film or an array of nanoparticles having modulated (amplified or attenuated) electrical properties, or optical properties, as further explained herein.

As used and demonstrated, the method of thermal doping allows "amplification or attenuation of at least one electrical property of a nanoparticle material"; namely, the presence of vacancies in the nanoparticle material may increase (or amplify) or decrease (or attenuate) any one electrical property of the nanoparticle material, in comparison to the same property when measured on the undoped nanoparticle material (namely measured prior to thermal doping). Such properties may be selected from charge, conductance, impedance, resistance, voltage, current, potential, polarization and others. In some embodiments, thermal doping amplifies conductance of the nanoparticle material.

Thermal doping leading to vacancy formation, as used herein, refers to the introduction of an imperfection or a point defect in a crystal lattice, wherein an atom is expelled from one of the lattice sites. A vacancy may switch site with a neighboring atom. Without wishing to be bound by theory, the vacancy may be formed in the crystal at one surface, diffuse through the crystal, and be emitted from the crystal at another surface. The vacancies may aggregate and form aggregates of vacancies or clusters of vacancies. Each cluster or aggregate of vacancies may comprise a plurality (more than one) of vacancies.

The number of vacancies per nanocrystal (nanoparticles) is between 1 to 1,000 vacancies per nanocrystal. In further embodiments, the number of vacancies is between 1 to 500 vacancies. In further embodiments, the number of vacancies is between 1 to 300 vacancies. In further embodiments, the number of vacancies is between 20 to 250 vacancies. In further embodiments, the number of vacancies is between 1 to 200 vacancies. In further embodiments, the number of vacancies is between 10 to 250 vacancies. In further embodiments, the number of vacancies is between 20 to 250 vacancies.

In additional embodiments, the number of vacancies is between 1 to 150 vacancies, or between 2 to 150, or between 5 to 150, or between 2 to 100, or between 5 to 100, or between 2 to 80, or between 5 to 80, or between 2 to 70, or between 5 to 70, or between 5 to 50, or between 2 to 50, or between 2 to 40, or between 2 to 30, or between 2 to 20, or between 2 to 10, or between 10 to 100 vacancies.

In some embodiments, the number of vacancies on average may be as low as 1 vacancy in 100,000 atoms; 1 in 10,000; 1 in 1,000; 1 in 100 or 1 vacancy in 10 atoms.

In some embodiments, the number of vacancies ranges from 0.001% to 20% of the number of lattice sites in the nanoparticle. In some embodiments, the number of vacancies ranges from 0.01% to 20% of the number of lattice sites in the nanoparticle. In some embodiments, the number of vacancies ranges from 0.1% to 20% of the number of lattice sites in the nanoparticle. In some embodiments, the number of vacancies ranges from 1% to 20% of the number of lattice sites in the nanoparticle. In some embodiments, the number of vacancies ranges from 2% to 20% of the number of lattice sites in the nanoparticle.

In some embodiments, the number of vacancies ranges from 2 to 15% of the number of lattice sites in the nanoparticle. In other embodiments, the number of vacancies is less than 15% of the number of lattice sites in the nanoparticle. In other embodiments, the number of vacancies is between 1% and 15% of the number of lattice sites in the nanoparticle. In further embodiments, the number of vacancies is between 5% and 15% of the number of lattice sites in the nanoparticle. In other embodiments, the number of vacancies is between 10% and 15% of the number of lattice sites in the nanoparticle.

In further embodiments, the number of vacancies is 0.0001%, 0.001%, 0.01%, 0.1%, 1%, 2%, 3%, 4%, 5%, 6%, 7%, 8%, 9%, 10%, 11%, 12%, 13%, 14% or 15% of the number of lattice sites in the nanoparticle.

In further embodiments, the number of vacancies is between 0.0001% and 0.001%, between 0.0001% and 0.01%, between 0.0001% and 0.1%, between 0.0001% and 1%, between 0.0001% and 2%, between 0.0001% and 3%, between 0.0001% and 4%, between 0.0001% and 5%, between 0.0001% and 6%, between 0.0001% and 7%, between 0.0001% and 8%, between 0.0001% and 9%, between 0.0001% and 10%, between 0.0001% and 11%, between 0.0001% and 12%, between 0.0001% and 13%, between 0.0001% and 14% or between 0.0001% and 15% of the number of lattice sites in the nanoparticle.

In further embodiments, the number of vacancies is between 0.0001% and 0.001%, between 0.001% and 0.01%, between 0.01% and 0.1%, between 0.1% and 1%, between 1% and 2%, between 2% and 3%, between 3% and 4%, between 4% and 5%, between 5% and 6%, between 6% and 7%, between 7% and 8%, between 8% and 9%, between 9% and 10%, between 10% and 11%, between 11% and 12%, between 12% and 13%, between 13% and 14% or between 14% and 15% of the number of lattice sites in the nanoparticle.

The thermally doped nanoparticles of the invention may be heavily doped or lightly doped. In some embodiments, the vacancy concentration being between $1\times10^{11}$ vacancies per cm$^3$ to $1\times10^{21}$ vacancies per cm$^3$. In some embodiments, the number of vacancies in a nanoparticle array ranges from $1\times10^{14}$ vacancies per cm$^3$ to $1\times10^{21}$ vacancies per cm$^3$. In further embodiments, the number of vacancies in the nanoparticle ranges from $1\times10^{16}$ vacancies per cm$^3$ to $1\times10^{21}$ vacancies per cm$^3$. In additional embodiments, the number of vacancies in the nanoparticle ranges from $1\times10^{16}$ vacancies per cm$^3$ to $1\times10^{20}$ vacancies per cm$^3$.

The number of vacancies, as detailed herein, may be further quantified based on the number of expelled atoms per nanoparticle. In some embodiments, the number of expelled atoms is between 1 to 100,000 atoms per nanoparticle. In some embodiments, the number of expelled atoms is between 1 to 10,000 atoms per nanoparticle. In some embodiments, the number of expelled atoms is between 1 to 1,000 atoms per nanoparticle. In further embodiments, the number of expelled atoms per nanoparticle is between 1 to 500 atoms. In further embodiments, the number of expelled atoms per nanoparticle is between 1 to 300 atoms. In further embodiments, the number of expelled atoms per nanoparticle is between 20 to 250 atoms. In further embodiments, the number of expelled atoms per nanoparticle is between 1 to 200 atoms. In further embodiments, the number of expelled atoms per nanoparticle is between 10 to 250 atoms.

In further embodiments, the number of expelled atoms per nanoparticle is between 20 to 250 atoms.

In additional embodiments, the number of expelled atoms per nanoparticle is between 1 to 150 atoms, or between 2 to 150, or between 5 to 150, or between 2 to 100, or between 5 to 100, or between 2 to 80, or between 5 to 80, or between 2 to 70, or between 5 to 70, or between 5 to 50, or between 2 to 50, or between 2 to 40, or between 2 to 30, or between 2 to 20, or between 2 to 10, or between 10 to 100 atoms.

In some embodiments, the number of expelled atoms ranges from between 0.0001% and 0.001%, between 0.0001% and 0.01%, between 0.0001% and 0.1%, between 0.0001% and 1%, between 0.0001% and 2%, between 0.0001% and 3%, between 0.0001% and 4%, between 0.0001% and 5%, between 0.0001% and 6%, between 0.0001% and 7%, between 0.0001% and 8%, between 0.0001% and 9%, between 0.0001% and 10%, between 0.0001% and 11%, between 0.0001% and 12%, between 0.0001% and 13%, between 0.0001% and 14% or between 0.0001% and 15% of the number of lattice sites in the nanoparticle.

In some embodiments, the number of expelled atoms ranges from 0.001% to 20% of the number of lattice sites in the nanoparticle. In some embodiments, the number of expelled atoms ranges from 0.01% to 20% of the number of lattice sites in the nanoparticle. In some embodiments, the number of expelled atoms ranges from 0.1% to 20% of the number of lattice sites in the nanoparticle. In some embodiments, the number of expelled atoms ranges from 1% to 20% of the number of lattice sites in the nanoparticle. In some embodiments, the number of expelled atoms ranges from 2% to 20% of the number of lattice sites in the nanoparticle.

In some embodiments, the number of expelled atoms ranges from 2 to 15% of the number of lattice sites in the nanoparticle. In other embodiments, the number of expelled atoms is less than 15% of the number of lattice sites in the nanoparticle. In other embodiments, the number of expelled atoms is between 1% and 15% of the number of lattice sites in the nanoparticle. In further embodiments, the number of expelled atoms is between 5% and 15% of the number of lattice sites in the nanoparticle. In other embodiments, the number of expelled atoms is between 10% and 15% of the number of lattice sites in the nanoparticle.

As used herein, thermal doping according to the invention is achievable under "conditions permitting formation of vacancies", not leading to fusion or sintering of the nanoparticles. These conditions are generally conditions of moderate thermal treatment involving heating the nanoparticles or arrays constructed thereof at low to moderate temperatures, such temperatures not causing the nanoparticles to fuse into a continuous non-particulate metal film. Thus, the "low or moderate conditions" refer to thermal conditions below the sintering or fusion temperature of the nanoparticle material, i.e., the nanoparticle form is preserved.

In some embodiments, the temperature is below the sintering temperature of the nanoparticle material and/or nanoparticles array. In some embodiments, the temperature is 30K (Kelvin degrees) below the sintering temperature of the nanoparticle material. In some embodiments, the temperature is 50K below the sintering temperature of the nanoparticle material. In some embodiments, the temperature is 100K below the sintering temperature of the nanoparticle material. In some embodiments, the temperature is 150K below the sintering temperature of the nanoparticle material. In some embodiments, the temperature is 200K below the sintering temperature of the nanoparticle material.

As known in the art, the Kelvin degrees may be converted to Celsius degrees by [° C.]=[K]−273.15.

In some embodiments, the thermal treatment involves heating at a temperature below 550K. In some embodiments, the thermal treatment involves heating at a temperature below 500K. In some embodiments, the temperature is below 450K. In some embodiments, the temperature is below 400K. In some embodiments, the temperature is below 380K. In some embodiments, the temperature is below 350K.

In some embodiments, the temperature ranges from 320K to 550K. In some embodiments, the temperature ranges from 320K to 500K. In some embodiments, the temperature ranges from 320K to 450K. In some embodiments, the temperature ranges from 320K to 400K. In some embodiments, the temperature ranges from 320K to 400K. In some embodiments, the temperature ranges from 350K to 450K. In some embodiments, the temperature ranges from 380K to 450K. In some embodiments, the temperature ranges from 320K to 380K. In some embodiments, the temperature ranges from 350K to 380K.

In some embodiments, the temperature ranges from 380K to 400K.

In some embodiments, the temperature ranges from 340K to 400K.

In some embodiments, the temperature ranges from 350K to 390K.

In some embodiments, heating at the defined temperature is continued over a period of several milliseconds. In further embodiments, heating is continued over a maximum period of several milliseconds. In some embodiments, heating is continued over a period of several milliseconds to several minutes. In some embodiments, heating is continued over a period of between 0.01 second and 120 minutes; between 0.1 second and 120 minutes; between 1 second and 120 minutes; between 0.01 second and 100 minutes; between 0.1 second and 100 minutes; between 1 second and 100 minutes; between 0.01 second and 20 minutes; between 0.1 second and 20 minutes; between 1 second and 20 minutes; between 0.01 second and 10 minutes; between 0.1 second and 10 minutes; or between 1 second and 10 minutes.

In some embodiments, heating at the defined temperature is continued over a period of between 1 and 25 minutes, between 1 and 20 minutes, between 1 and 15 minutes, between 1 and 10 minutes, or between 1 and 5 minutes.

In other embodiments, heating is continued over a period of at least 0.0001 second, at least 0.001 seconds, at least 0.01 seconds, at least 0.1 seconds, at least 1 second, at least 5 seconds, at least 10 seconds, at least 15 seconds, at least 20 seconds, at least 25 seconds, at least 30 seconds, at least 35 seconds, at least 40 seconds, at least 45 seconds, at least 50 seconds, at least 55 seconds, at least 60 seconds, at least 2 minutes, at least 4 minutes, at least 5 minutes, at least 10 minutes, at least 20 minutes, or at least 30 minutes.

In further embodiments, heating is continued over a period of 1, 2, 3, 4, 5, 6, 7, 8, 9, 20, 11, 12, 13, 14, 15, 16, 17, 18, 19, 20, 21, 22, 23, 24, 25, 26, 27, 28, 29, or 30 milliseconds.

In further embodiments, heating is continued over a period of 1, 2, 3, 4, 5, 6, 7, 8, 9, 20, 11, 12, 13, 14, 15, 16, 17, 18, 19, 20, 21, 22, 23, 24, 25, 26, 27, 28, 29, or 30 seconds.

In further embodiments, heating is continued over a period of 1, 2, 3, 4, 5, 6, 7, 8, 9, 20, 11, 12, 13, 14, 15, 16, 17, 18, 19, 20, 21, 22, 23, 24, 25, 26, 27, 28, 29, or 30 minutes.

Thermal treatment may be achieved by any means known in the art. In some embodiments, heating is achieved by an energy source.

In some embodiments, heating is achieved by a heating source. The heating source may be any source which may cause an increase in the temperature of the nanoparticles or arrays thereof, directly or indirectly, such source may be a heating plate or a laser induced heating. Typically, heating is carried out under inert conditions.

In some embodiments, thermal treatment is achieved by radiation. In some embodiments, the radiation is a lamp radiation. In some embodiments, the radiation is a laser beam radiation (laser induced heating). The laser may be a continuous wave laser or a pulse laser. The laser beam is chosen so as to have a beam wavelength corresponding to the wavelength range of the absorption spectra of the nanoparticle material or of the matrix in which material is present or of the substrate on which the nanoparticle are deposited. In some embodiments, the wavelength beam is in the visible, UV, NIR, or IR regime. Non-limiting examples of laser beam wavelengths 532 nm (green, visible), 355 nm, 266 nm (UV), 1064 nm (IR).

In some embodiments, the intensity and/or power (and/or other parameters defined by the laser operation) are selected to induce energy (temperature) below the sintering energy (temperature) of the nanoparticle material and/or nanoparticles array, (i.e. the laser parameters are selected to permit preservation of the nanoparticles in their nanoparticle form).

In some embodiments, the power of the laser (or radiation source) is between 1 nW to 20 mW. In other embodiments, the power of the laser is between 1 nW to 15 mW. In other embodiments, the power of the laser is between 1 nW to 10 mW. In other embodiments, the power of the laser is between 1 nW to 7 mW.

In some embodiments, the intensity of the laser (or radiation source) is between $1 \cdot 10^1$ W/cm$^2$ to $1 \cdot 10^{10}$ W/cm$^2$. In other embodiments, the intensity of the laser is between $1 \cdot 10^3$ W/cm$^2$ to $1 \cdot 10^7$ W/cm$^2$. In other embodiments, the intensity of the laser is between $1 \cdot 10^4$ W/cm$^2$ to $1 \cdot 10^6$ W/cm$^2$. In other embodiments, the intensity of the laser is between $1 \cdot 10^5$ W/cm$^2$ to $1 \cdot 10^6$ W/cm$^2$.

In some embodiments, the laser intensity is between $1 \cdot 10^3$ W/cm$^2$ to $1 \cdot 10^8$ W/cm$^2$. In some embodiments, the laser intensity is between $1 \cdot 10^3$ W/cm$^2$ to $1 \cdot 10^7$ W/cm$^2$. In some embodiments, the laser intensity is between $1 \cdot 10^3$ W/cm$^2$ to $1 \cdot 10^6$ W/cm$^2$.

In some embodiments, the laser intensity is between $1 \cdot 10^4$ W/cm$^2$ to $1 \cdot 10^8$ W/cm$^2$. In some embodiments, the laser intensity is between $1 \cdot 10^4$ W/cm$^2$ to $1 \cdot 10^7$ W/cm$^2$. In some embodiments, the laser intensity is between $1 \cdot 10^4$ W/cm$^2$ to $1 \cdot 10^6$ W/cm$^2$.

In some embodiments, the laser intensity is between $1 \cdot 10^5$ W/cm$^2$ to $1 \cdot 10^8$ W/cm$^2$. In some embodiments, the laser intensity is between $1 \cdot 10^5$ W/cm$^2$ to $1 \cdot 10^7$ W/cm$^2$. In some embodiments, the laser intensity is between $1 \cdot 10^5$ W/cm$^2$ to $1 \cdot 10^6$ W/cm$^2$.

In some embodiments, the laser intensity is about $1 \cdot 10^4$ W/cm$^2$, about $1 \cdot 10^5$ W/cm$^2$, about $1 \cdot 10^6$ W/cm$^2$, about $1 \cdot 10^7$ W/cm$^2$ or about $1 \cdot 10^8$ W/cm$^2$.

In some embodiments, laser heating is achievable at 532 nm (green laser) with a laser intensity of ~$2 \cdot 10^5$ W/cm$^2$ and exposure times varying from 10 sec to 10 min.

Thus, the invention provides a method for introducing or affecting thermal doping in a nanoparticles or array thereof, the method comprising thermally treating said nanoparticle or array thereof at a temperature below the sintering temperature of the nanoparticle material, said temperature being typically below 500K. In some embodiments, the thermal treatment permits formation of at least one vacancy or at least one cluster of vacancies, wherein said treatment does not permit loss of chemical structure or integrity of the nanoparticle material.

The invention further provides a method for introducing or affecting thermal doping in a nanoparticles or array thereof, the method comprising, treating the nanoparticles or array thereof with a laser at 532 nm (green laser), at an intensity of ~2·10$^5$ W/cm$^2$ and over a period of time varying from 10 sec to 10 min. In some embodiments, the thermal treatment permits formation of at least one vacancy or at least one cluster of vacancies, wherein said treatment does not permit loss of chemical structure or integrity of the nanoparticle material.

In some embodiments, the thermal treatment permits altering the density of states of the nanoparticle material and/or array of nanoparticles by introducing additional states or energy bands. In some embodiments, the additional states are within the band gap.

In some embodiments, the thermal treatment permits shifting the band edge and/or Fermi energy of said nanoparticle material and/or array of nanoparticles. In some embodiments, the band edge or the Fermi energy is altered to a higher energy or lower energy. In some embodiments the band edge or the Fermi energy is altered to a higher energy.

In some embodiments, the thermal treatment permits altering the optical or spectroscopic properties (e.g., absorbance, photoluminescence, etc) of said nanoparticle material and/or array of nanoparticles.

In some embodiments, the thermal treatment permits shifting the band gap of said nanoparticle material and/or array of nanoparticles. In some embodiments, the band gap is altered to a higher energy or lower energy. In some embodiments, the band gap is altered to a higher energy.

In some embodiments, the thermal treatment permits introducing or shifting plasmon states within said nanoparticle material and/or array of nanoparticles. In some embodiments, the plasmon band is altered to a higher energy or lower energy. In some embodiments, the band edge or the plasmon is altered to a higher energy.

In some embodiments, the thermal treatment permits altering the electrical properties (as detailed hereinabove, e.g., charge, conductance, impedance, resistance, voltage, current, potential, polarization) of said nanoparticle material and/or array of nanoparticles.

Thermal doping may be achievable in any population of nanoparticles. In some embodiments, the nanoparticles are formed into arrays of nanoparticles. Thus, the invention provides methods for forming thermal doping in arrays of nanoparticles. The arrays may be of any pattern or dimension. The arrays may comprise one or more layers of nanoparticles stacked upon each other (3D arrays). In other embodiments, the arrays may be in the form of a single layer of nanoparticles (2D arrays). Whether the array is a 2D or a 3D array, it may be of any shape and contour; the array may be a line pattern of nanoparticles or any symmetrical or asymmetrical 2D or 3D shape. The array may be formed as a continuous array or as multiple spaced apart arrays, each of which may be identical or different in nature, form, shape, constitution or size.

In some embodiments, the array may be of any arrangement of nanoparticles, such as lines, circles, triangles, cubes, etc.

An array according to the invention may comprise one type of nanoparticles (nanoparticle material) or nanoparticles of more than one material, shape and/or size. The nanoparticles in the array may be constructed at any arrangement. For example, the array may be a 3-layered structure, wherein each layer comprises the same or different type of nanoparticles.

The array may be formed in various methods and via different mechanisms. In some embodiments, the array may be formed via self-assembly. In some embodiments, the array may be formed by coating a substrate surface by a method selected from spin coating, roll coating, spray coating, dip coating, flow coating, dispensing, printing, ink-jet printing, flexography, stencil printing, imprinting, xerography, lithography, nanoimprinting, stamping and any other deposition method known in the art. In some embodiments, the array is formed by placing a nanoparticles solution on a substrate and (slowly) evaporating the liquid medium in which the nanoparticles are contained.

The process of the invention thus provides means to construct an array of nanoparticles having at least one region or pattern formed of vacancy-doped nanoparticles.

The invention additionally provides a method of patterning or forming a pattern of thermally doped nanoparticles on a surface. The method comprising providing a population of thermally doped or thermally undoped nanoparticles in the form of a solution, and permitting said nanoparticles to self-assemble at the surface by any of the methods described herein. In some embodiments, the method permits for patterned doping via local heating induced by focused laser irradiation.

Where the pattern is formed of undoped nanoparticles, thermal doping by, e.g., laser radiation, may be employed to provide a specifically shaped pattern of vacancy-rich nanoparticles. Thus, in some embodiments, a substrate surface may be fully or partially covered with a film, layer or coat or array of undoped nanoparticles, and thereafter treated by a thermal doping method according to the invention to form a pattern of vacancy rich nanoparticles. This patterning method may be used to form conductive features and electric circuits.

The pattern or region occupied or coated or covered or formed of thermally doped, vacancy rich nanoparticles may be a p-type doped region or pattern or an n-type doped region or pattern. The region or pattern may be a continuous pattern or a plurality of spaced apart regions or patterns. The region or pattern may be of any shape (e.g., films, lines, circle, dots . . . ). The region or pattern may be the entire array. Where a surface is coated or associated with a plurality of arrays, or where an array is composed of multiple regions or patterns, each individual array or region or pattern may have a different vacancy profile along the array (laterally or vertically).

The region size may be as small as one nanoparticle size or as large as a may be dictated by, e.g., the electronics industry. The region size may be the full size of an array. In some embodiments, a region size is defined by the size of the final element function (e.g., the size of the gate in an electronic device). In some embodiments, the array is patterned as an electrical circuit.

In some embodiments, a region size is in the nanometer scale. In some embodiments, the size is in the sub-micrometer scale. In some embodiments, the size is in the micrometer scale. In some embodiments, the size is in the millimeter scale. In some embodiments, the size is in the centimeter scale.

An array of the invention may comprise at least one p-doped region along with at least one n-doped region and/or undoped (or intrinsic) regions. The array of the invention may comprise p-n or p-i-n junctions, or any other junction structure (such as, p-n-p, n-p-n, $p^+$-n-$p^+$) along the array. The array may be patterned into a multiple-junction structure.

In some embodiments, the arrays of the invention may be ordered or disordered arrays, monolayers or multilayers of thermally doped nanocrystals. In some embodiments, the arrays are formed by slow evaporation (as detailed herein) or by spin/drop casting.

The arrays may be formed from thermally doped nanocrystals or from undoped (intrinsic) nanoparticles, in which case thermal doping may follow after the array or pattern is formed. In some embodiments, where the thermal doping is carried out after an array of undoped nanoparticles is formed, the array of nanoparticles may be deposited immediately prior to thermal doping or may be pre-formed in advance.

Additionally, the patterning or thermal doping may be carried out on a pre-patterned electronic device comprises at least one surface region covered with a coat, film or layer of undoped nanoparticles and that region is subsequently patterned, e.g., by laser induced heating to produce e.g., a conductive pattern of vacancy rich nanoparticles.

Thus, the invention provides a method of arraying or patterning which comprises:
    obtaining an array of nanoparticles (the array may be formed and structured as detailed herein); and
    thermally treating said nanoparticles in the array under conditions permitting thermal doping of the nanoparticles material, as detailed herein. The thermal treatment need not be over the full surface of the nanoparticles array. The treatment may be conducted on a region within said array, which may or may not be continuous. In some embodiments, thermal doping is achieved via laser treatment to form a pattern on said array, said pattern being composed of vacancy rich nanoparticles.

Additionally, the invention provides a method of arraying or patterning, the method comprising:
    obtaining thermally doped, vacancy rich, nanoparticles; and
    forming an array of said nanoparticles on a surface.

The "array of nanoparticles" as used herein, refers to a pattern of closely packed nanoparticles, wherein the nanoparticles are positioned closely to one another, on a surface of a substrate, wherein the distance between the nanoparticles being less than 1 nm, less than 2 nm, less than 3 nm, less than 5 nm, less than 10 nm or less than 20 nm. The array may be a two-dimensional array of nanoparticles. The array of nanoparticles may be a superlattice.

The arrays of the invention may be further characterized as above.

An array according to the invention may be formed on a surface region of any substrate material. The substrate and surface materials may or may not be the same. In some embodiments, the array is formed on a surface material selected from glass, Si, $SiO_2$, Si/$SiO_2$, plastic, paper, flexible surfaced, metal (e.g., gold), semiconductor material, an insulator material, and any other material.

In some embodiments, the substrate is a thermally sensitive substrate. In other embodiments, the substrate is a thermally stable substrate coated with a film of a thermally sensitive material, wherein the array of nanoparticles is positioned on a surface region of said thermally sensitive material.

In some embodiments, the substrate or the surface material of said substrate is thermally sensitive. In some embodiments, the thermally sensitive materials are polymeric materials.

In some embodiments, the substrate is a glass substrate coated with a film of Si, $SiO_2$ or Si/$SiO_2$, on top of which a film of nanoparticles, thermally doped or undoped is formed in accordance with the invention.

A method according to the invention may further comprise a step of replacing an atom of a nanoparticles or nanocrystals with another atom. This may be achieved by thermally treating a nanoparticles or an array thereof, as detailed herein, to form vacancies in the nanoparticles material, and thereafter treating said vacancy rich nanoparticles with an atom or a foreign material to enable insertion of said foreign atom into the lattice vacancy.

Thus, the invention further provides a method of doping a nanoparticle with at least one foreign atom, said method comprising:
    thermal doping a nanoparticle material according to methods of the invention; and
    inserting one or more plurality of foreign atoms into the vacancies formed in said material.

The "foreign atom" is typically different from the atom which is expelled from the nanoparticle. Thus, in cases where vacancies are formed in copper chalcogenide nanoparticles, the foreign atom(s) is not copper. In some embodiments, the foreign atom(s) is selected to induce modulation of at least one electrical property associated with the vacancy-doped nanoparticles. The electrical properties may be selected from so called free charge (the system remains in overall electrical neutrality as common in doping of semiconductors), conductance, impedance, resistance, voltage, current, potential, polarization and others.

In some embodiments, the foreign atom (or ion) is Li or Mg or Na or K or Rb or Cs or Be or Ca or Sr or Ba or Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or any combination thereof.

In some embodiments, the foreign atom (or ion) is Mg or Na or K or Cs or Ca or Co or Mn or Fe.

In some embodiments, the foreign atom (or ion) is Na.

In another aspect the invention provides at least one thermally doped nanoparticle formed by the method of the invention.

In another aspect, there is provided a thermally doped nanoparticle or an array thereof.

As a person versed in the art would realize, the unique process of the invention permits the production of pristine vacancies, with no residual oxidizing products which are characteristic of methods of the art. Additionally, arrays and nanocrystal populations in which vacancies are formed, do not necessarily exhibit annealing characteristics, as explained herein.

The "nanoparticle" (or nanocrystal) being doped in accordance with the present invention, is a colloidal nanoparticle of at least one metal, insulator or semiconductor material, wherein the nanoparticle dimensions (diameter or length) are at the nanometric range (between 1 and 1000 nm). In some embodiments, the nanoparticles of the invention are between 1 nm to 100 nm in length or diameter. In other embodiments, the doped nanoparticles are on average in the range of 1 nm to 50 nm in length or diameter. In other embodiments, the doped nanoparticles are on average in the range of 1 nm to 20 nm in length or diameter.

In some embodiments, the nanoparticle is a nanocrystal. In other embodiments, the nanoparticle has one or more crystal domains.

The nanoparticle material, in other words, the material from which the nanoparticle is made of, may be selected from a metal, an insulator and a semiconductor material.

In some embodiments, the nanoparticles are of a semiconductor material selected from semiconductor materials having an atom or a metal atom of low chemical potential or low vacancy formation energy.

In some embodiments, the nanoparticles are of a semiconductor material selected to have a rich phase diagram, the rich phase diagram having above 3 phases, above 5 phases, above 7 phases, or above 10 phases.

In some embodiments, the vacancy doped nanoparticles are of a material having a density of states different from that of the undoped nanoparticle material.

In some embodiments, the nanoparticles are isotropic or anisotropic shaped nanoparticles. The nanoparticles may be selected to display any branched or net structures. Without being limited thereto, the nanoparticles may be symmetrical or unsymmetrical, may be elongated having a rod-like shape, round (spherical), elliptical, branch, network or any irregular shape. In some embodiments, the nanoparticles are selected from quantum dots (QD), nanocrystals, nanospheres, nanorods, branched nanoparticles, multipods such as tetrapod and others.

In some embodiments, the nanoparticles are quantum dots (QD) of so-called 0 dimension (0D), or quantum rods being intermediate systems between 0D to 1D. In some embodiments, the QD are selected to have a size range from several nanometers to a hundred nanometers. In some embodiments, the QDs are 2 nm to 50 nm in diameter.

The nanoparticle material may be selected from elements of Group I-VII, Group II-VI, Group III-V, Group IV-VI, Group and Group IV semiconductors and combinations thereof.

In some embodiments, the semiconductor material is a Group I-VII semiconductor, being selected from CuCl, CuBr, CuI, AgCl, AgBr, AgI and the like.

In some embodiments, the semiconductor material is selected from (metal ion)$_x$(inorganic ion)$_y$. In some embodiments, the semiconductor material is selected from Cu$_x$(inorganic ion)$_y$ or Ag$_x$(inorganic ion)$_y$ or Cu$_x$(organic ion)$_y$, Ag$_x$(organic ion)$_y$. In some embodiments, the semiconductor material is selected from Cu$_x$(chalcogenide)$_y$ or Ag$_x$(chalcogenide)$_y$.

In some embodiments, x and y are independently selected to have a value from 0.01 to 10. In further embodiments, x and y are independently selected to have a value from 0.01 to 5. In further embodiments, x and y are independently selected to have a value from 0.1 to 5. In further embodiments, x and y are independently selected to have a value from 0.1 to 3. In further embodiments, x and y are independently selected to have a value from 0.1 to 2.

In further embodiments, the nanoparticles are of a material selected from copper sulfides; in some embodiments, the material is selected in a non-limiting manner from Cu$_2$S, Cu$_2$Se, CuInS$_2$, CuInSe$_2$, Cu$_2$(ZnSn)S$_4$, Cu$_2$(InGa)S$_4$, CuInS$_2$, CuGaS$_2$, CuAlS$_2$ and mixed copper-iron sulfides such as Cu$_5$FeS$_4$ (Bornite) and CuFeS$_2$ (chalcopyrite).

In further embodiments, the material is selected from copper selenides; in some embodiments, the material is selected in a non-limiting manner from Cu$_2$Se, CuInSe$_2$, CuInSe$_2$, Cu$_2$(ZnSn)Se$_4$, Cu$_2$(InGa)Se$_4$, CuInSe$_2$, CuGaS$_{e2}$, CuAlSe$_2$ and mixed copper-iron selenides such as Cu$_5$FeSe$_4$ and CuFeSe$_2$.

In further embodiments, the material is selected from copper teleroides; in some embodiments, the material is selected in a non-limiting manner from Cu$_2$Te, CuInTe$_2$, CuInTe$_2$, Cu$_2$(ZnSn)Te$_4$, Cu$_2$(InGa)Te$_4$, CuInTe$_2$, CuGaTe$_2$, CuAlTe$_2$ and mixed copper-iron telorides such as Cu$_5$FeTe$_4$ and CuFeTe$_2$.

In further embodiments, the material is selected from silver sulfides; in some embodiments, the material is selected in a non-limiting manner from Ag$_2$S, Ag$_2$Se, AgInS$_2$, AgInSe$_2$, Ag$_2$(ZnSn)S$_4$, Ag$_2$(InGa)S$_4$, AgInS$_2$, AgGaS$_2$, AgAlS$_2$ and mixed silver-iron sulfides such as Ag$_5$FeS$_4$ and AgFeS$_2$.

In further embodiments, the material is selected from silver selenides; in some embodiments, the material is selected in a non-limiting manner from Ag$_2$Se, AgInSe$_2$, AgInSe$_2$, Ag$_2$(ZnSn)Se$_4$, Ag$_2$(InGa)Se$_4$, AgInSe$_2$, AgGaS$_{e2}$, AgAlSe$_2$ and mixed silver-iron selenides such as Ag$_5$FeSe$_4$ and AgFeSe$_2$.

In further embodiments, the material is selected from silver teloride; in some embodiments, the material is selected in a non-limiting manner from Ag$_2$Te, AgInTe$_2$, AgInTe$_2$, Ag$_2$(ZnSn)Te$_4$, Ag$_2$(InGa)Te$_4$, AgInTe$_2$, AgGaTe$_2$, AgAlTe$_2$ and mixed silver-iron selenides such as Ag$_5$FeTe$_4$ and AgFeTe$_2$.

In some embodiments, the material is a ternary material such as CuInS, CuInSe, CuInTe, AgInS, AgInSe or AgInTe In some embodiments, the material is a quaternary material such as CuInGaS, CuInGaSe, CuInGaTe, CuInS$_2$, CuInSe$_2$, CuInTe$_2$, CuGaS$_2$, CuGaSe$_2$, CuAlSe$_2$, CuGaTe$_2$, CuAlTe$_2$, AgInGaS, AgInGaSe, AgInGaTe, AgInS$_2$, AgInSe$_2$, AgInTe$_2$, AgGaS$_2$, AgGaSe$_2$, AgAlSe$_2$, AgGaTe$_2$ or AgAlTe$_2$.

In some embodiments, the material is Cu$_2$S or Ag$_2$S.

In some embodiments, the material is Cu$_2$S.

The invention further provides a conductive pattern or a process for obtaining a conductive pattern of a semiconductor material, the conductive pattern being comprised of a plurality of vacancy doped semiconductor nanoparticles, the nanoparticles maintaining their nanoparticle shape and morphology. As detailed herein, the conductive pattern is not in the form of a sintered or annealed pattern.

The processes and products of the invention find utility in a vast range of industrial applications, such as application in electrical devices, optical devices, plastic devices, transparent devices, consumer electronics, industrial electronics, wireless systems, space applications, and many other applications.

In some embodiments, the process of the invention may be used for constructing a plastic electronics device.

In some embodiments, the process of the invention may be used for constructing a field effect transistor (FET) on an active device area of a device substrate; the process comprising the step of thermally doping at least source and drain regions of a material to form source and drain contact junctions. The device may be a plastic device.

In some embodiments, the process of the invention is used for producing heating elements and thermal insulators.

In some embodiments, the process of the invention is used for producing catalytic materials.

In a further aspect, the invention provides a device comprising at least one nanoparticle or array according to the invention or obtainable by a process of the invention. The device may be a plastic device or comprise a heat-sensitive element.

In some embodiments, the device is an electronic device (transistor, diode) in a form selected from n-p-n, p-n-p and n-i-p.

In some embodiments, the device is selected from a diode and/or a transistor and/or an electronic circuit component and/or an integrated circuit and/or a detector and/or a switch and/or an amplifier and/or a transducer and/or a laser and/or a tag and/or a photoconductor; a photodiode and/or a photovoltaic cell and/or a light emitting diode (LED) and/or a light sensor and/or a display and/or and a large area display array.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 1A is powder XRD scattering curves of as synthesized $Cu_2S$ NC films under inert environment compared to standard diffraction spectra of stoichiometric bulk $Cu_2S$ (chalcocite) and the copper depleted $Cu_{1.96}S$ (djurleite) phases, lower and upper axis, respectively. The peak at $2\theta=40.8°$ is unique for the low chalcocite $Cu_2S$ phase (marked with arrows).

FIG. 1B is the absorbance spectra of highly stoichiometric as-synthesized $Cu_2S$ NCs (curve a) which do not exhibit a near IR plasmon feature signifying low charge carrier concentration. After exposure to oxygen (curve b) the appearance of a local surface plasmon is seen, signifying a significant induction of copper vacancies.

FIG. 2A High resolution scanning electron micrograph (HRSEM) of NCs array between electrodes (arrows) (see inset in FIG. 2D); scale bar 200 nm.

FIG. 2B HRSEM of Self assembled highly ordered superlattices a few microns in size; scale bar 150 nm (left hand side; marked b) and 5 micron (right hand side; marked e). SAXS raw (FIG. 2B left hand side inset) and FIG. 2C is the azimuthally integrated data measured on NC arrays showing peaks manifesting superlattice ordering. The first peak is composed of two peaks one at $q\cong0.49$ nm$^{-1}$ which is attributed the hexagonal ordering of the $Cu_2S$ NC monolayer parallel to the substrate. The second peak at $q\cong0.53$ nm$^{-1}$ is attributed cubical ordering of the $Cu_2S$ NC monolayer perpendicular to the substrate. The oriented 2D pattern presents features of hexagonal order, which is confirmed by the relative positions of the harmonics. Scattering curves prior (curve a) and after (curve b) thermal doping are compared, indicating a slight decrease, by 0.14 nm, in the inter-NC distance.

FIG. 2D depicts film conductance at 1V vs. temperature, exhibiting minor temperature dependence below 300K (solid curve). At elevated temperatures (350-400K), film conductance increases significantly. Error bars depict the conductance changes at these temperatures with annealing time (FIG. 2F).

FIG. 2E presents plots of $I_d$ versus $V_{sd}$ at 20K (curve a), and after the thermal doping process at 380K (curve b), showing increase in conductance by ~6 orders of magnitude. Both data sets (FIG. 2D-E) were acquired on the disordered arrays. $Cu_2S$ NCs were 14 nm in diameter with hexagonal truncated bi-prism geometry, as depicted in the HRTEM image and cartoon presented in (FIG. 2D inset).

FIG. 2F presents $I_d$ measurements vs. treatment time, during the thermal doping process measured at 380K. The increase in current exhibit a logarithmic or stretched expo-nential time dependence (left frame). After ~20 minutes of thermal treatment, a significant contribution to the conductance is already measured.

FIG. 3A G(T) curves after the thermal treatment at various measurement temperatures. Repeated cooling (triangles) and heating (circles) indicate no hysteresis effect below ~350K, demonstrating the irreversibility of the conductance increase.

FIG. 3B Arrhenius-like plot of the natural logarithms of the conductance vs. the inverse of the thermal doping temperature, for three different samples measured at room temperature (squares, circles, triangles) and for one sample at various measurement temperatures (solid curve—300K, dashed curve—200K, dotted curve—100K). The slope of the fitted lines according to Arrhenius equation yields $E_a/k_B$ where $k_B$ is the Boltzmann constant and $E_a$ is the activation energy for forming a Cu vacancy. The slope of the fitted lines yields the Cu vacancy formation energy $E_{vf}\sim1.6$ eV.

FIG. 4A shows Thermo-gravimetric analysis (TGA) curve (solid curve) and derivative (dotted curve), showing no detectable reduction in weight upon heating up to temperatures of 500K. Significant weight losses are recorded only above 530K and around 850K these are attributed to organic ligands loss.

FIG. 4B Differential scanning calorimetry (DSC) curve showing a reversible peak around 360K in the heating cycle (curve a) and 340K in the cooling cycle (curve b). These are attributed to the documented $Cu_2S$ low-to-high chalcocite phase transition, but not the ligands loss which commences at higher temperatures and is not reversible.

FIG. 6A AFM (atomic force microscopy) topography;

FIG. 6B optical phase micrographs; and

FIG. 6C HRSEM (high resolution scanning electron microscopy) micrographs depicting $Cu_2S$ NC deposited on flame annealed atomically flat Au substrates. These self assembled highly ordered monolayers were used for the CAFM (conductance AFM) local conductance measurements. Scale bars are 70/70/50 nm respectively.

FIGS. 7A-F: Single NC thermal doping effect.

FIG. 7A, B: C-AFM measurements (inset scheme in FIG. 7B) performed on an ordered monolayer of $Cu_2S$ NCs deposited on annealed Au substrate. AFM topographic (left) and current (right) micrographs before thermal doping, measured with 3 V tip-sample bias voltage, scale bar 50 nm Cross-section along the line drawn in the current image is plotted before (FIGS. 7A, B curve a), and after thermal doping at 380 K (FIG. 7B curve b), showing 2 orders of magnitude local enhancement.

FIG. 7C Histograms of current values from CAFM local current measurements measured on hundreds of NCs. Shown are the results for as synthesized NC (curve a), after thermal treatment at 350K (curve b) and at 380K (curve c). The data depicts a clear increase in conductance for the 380K treated sample. The steep increase around 20 nA originates from saturation of the CAFM current amplifier around these values, suggesting even higher conductance values for thermal doped NCs.

FIG. 7D inset STM (scanning tunneling microscopy) current map of a single $Cu_2S$ NC, scale bar 4 nm FIG. 7D dI/dV-V tunneling spectra, measured at 4.2 K before (curve a) and after (curve b) thermal doping.

FIG. 7E Histograms of relative band-offset values measured on 24 single NCs, comparing the thermally doped and pre-doped populations. An increase in the relative band offset toward positive values is observed after thermal doping akin to p-type doping.

FIG. 7F (left, middle, right) Additional representative STS (scanning tunneling spectroscopy) curves measured on single $Cu_2S$ NCs before (curves a) and after (curves b) the 'full scale' thermal doping process, (heating to 380K). The data depicts the spread in the relative band offset shifts and the appearance of in-gap states. The distribution of band offset shifts is presented by the histogram in FIG. 7E.

FIG. 8A exhibits local thermal doping conducted using focused laser light as the heat source and under inert environment, as depicted in the scheme.

FIG. 8B presents a Current($I_d$) measurements vs $V_{sd}$ resulted in currents of ~25 pA at 10 V when measured at 300K before the thermal doping process.

FIG. 8C presents a Current($I_d$) measurements vs $V_{sd}$ After illuminating the array with an intense focused laser beam, a pronounced conductance increase was observed, yielding currents of ~1 µA at 0.1 V when measured at 300K. The increase in conductance was irreversible when cooling down the sample (200K, 20K).

FIG. 9A Normalized film conductance vs. temperature before (native) and after irradiation by laser powers of 1, 5, and 7 mW. G was normalized by the respective $G_0$ at 300K of the as-prepared film. Irradiation by 7 mW increases the film conductance by six orders of magnitude. (FIG. 9A inset) Optical micrograph showing super-lattices deposited on micro-electrodes; circle marks the local laser irradiated thermally doped region, scale bar is 8 µm.

FIG. 9B top KPM (Kelvin Probe Microscopy) potential and FIG. 9B bottom topography maps of laser thermally doped NC array. Scan area is 6 µm². FIG. 9B middle Line cross-sections taken along the lines marked in b and d. The potential cross-section (curve a) depicts a ~80 mV increase with respect to the background, whereas the topography cross-section (curve b) shows that no change was inflicted to the array morphology due to laser irradiation.

FIG. 9C KPM potential map depicting pattered doping achieved via optical thermal doping and controlled movement of the substrate stage, scale bar is 5 µm.

DETAILED DESCRIPTION OF EMBODIMENTS

Tuning electrical properties of semiconductor nanocrystals (NCs) is of importance both from fundamental and practical points of view. Various doping methods for NCs have been demonstrated by introducing dopants into NCs or by adding charge carriers through surface modifications. Lattice vacancies may also lead to excess charge carriers enabling a dopant-less method for tuning the electrical properties of NCs.

The novel approach of the invention to doping of NC films is termed "thermal doping". This approach is demonstrated for $Cu_2S$ NC arrays where moderate temperature treatment leads to significant conductance enhancement in a controlled manner.

Copper sulfide is an interesting semiconductor material widely studied for its structural complexity that presents itself in a rich phase diagram with many structural phase transitions. For example, above 105° C. stochiometric $Cu_2S$ is high chalcocite (β phase), in which the sulphur atoms are arranged in a hexagonal lattice while the copper atoms are virtually 'fluid'. Below 105° C., the hexagonal sulfur lattice stays rigid while the copper atoms pack in a complex interstitial manner, giving rise to a lower symmetry monoclinic phase (γ phase), also known as low chalcocite. In addition, $Cu_2S$ has a tendency for Cu deficiency which originates from the low chemical potential of Cu(0). Vacancies can form by the loss of copper atoms. The results in a series of Cu depleted materials, for example, the near stochiometric Djurleite phase ($Cu_{1.96}S$), which is crystallographically distinct from low chalcocite and has a monoclinic structure with 248 copper and 128 sulfur atoms in the unit cell. Due to high ionic mobility of Cu ions, vacancies can cluster together in groups of four per $Cu_{20}S_{12}$ unit, with the remainder of the copper ordered similarly to low chalcocite.

"Thermal doping" was demonstrated for $Cu_2S$ NC films via temperature induced copper vacancy formation at moderate temperatures. The doping effect is proven using transport measurements, conductive atomic force microscopy (CAFM) and scanning tunneling microscopy (STM).

p-type doping was identified by scanning tunneling spectroscopy (STS) of single $Cu_2S$ NCs and is attributed to formation of Cu lattice vacancies within the NCs. Unlike previous methods for aliovalent doping, which introduce either substitutional or interstitial impurities, in the thermal doping approach no additional impurities are introduced to the NC; rather the opposite process takes place, the expulsion of atoms from the intrinsic material. Furthermore, laser induced heating was used to conduct the thermal doping process, opening the path to patterning via use of local heating by a focused laser beam in the far or near-field.

Figure 1A:
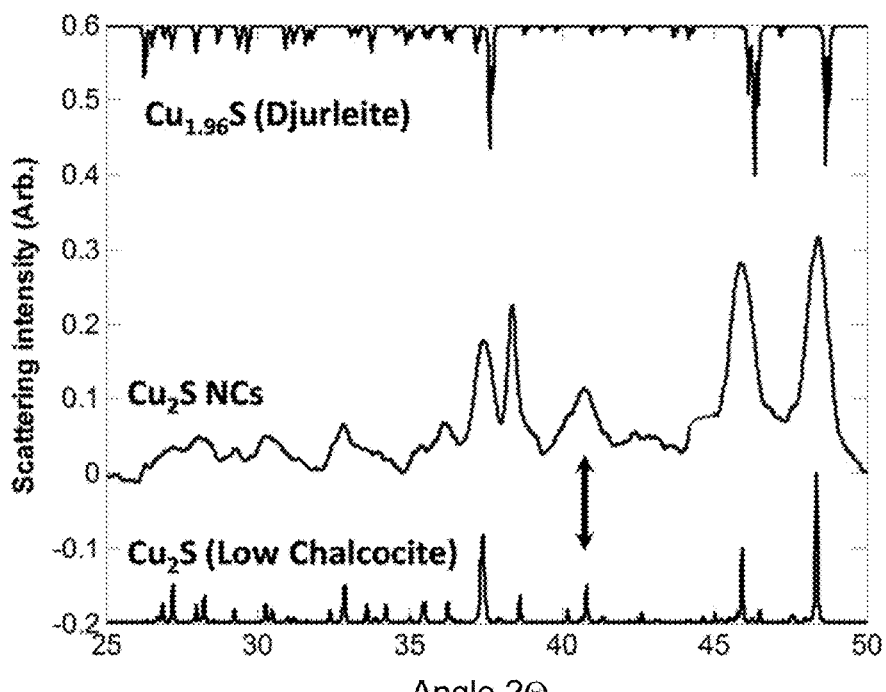
FIGS. 1A-B.
Figure 1B:
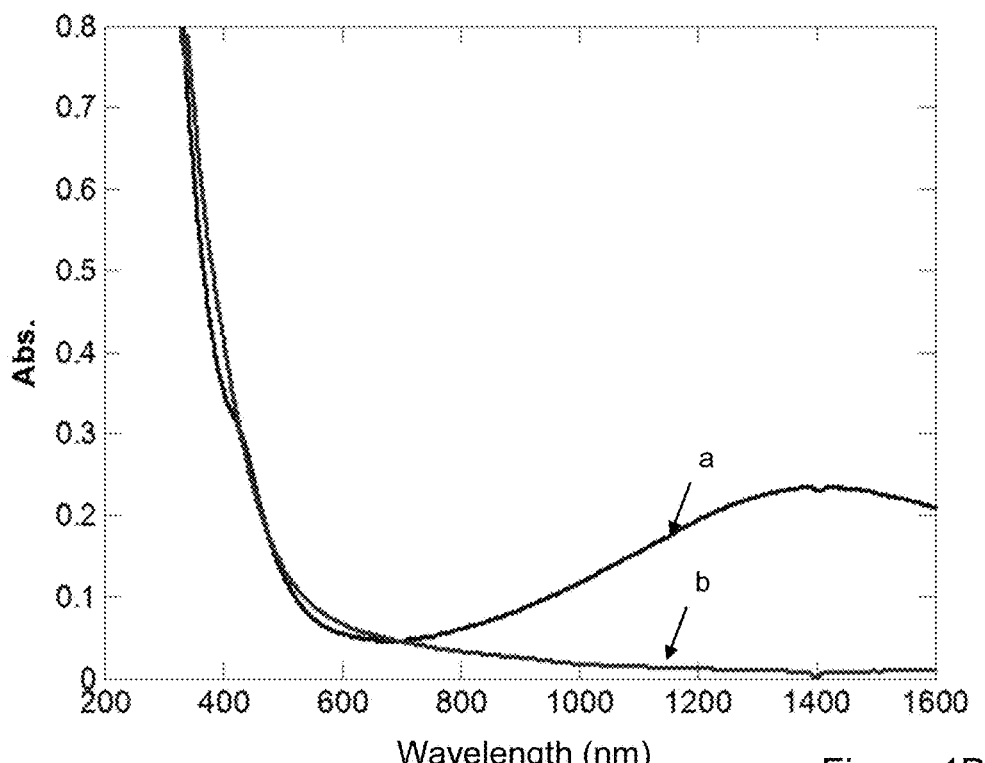

Highly monodisperse and faceted 14 nm $Cu_2S$ NC were synthesized by a high temperature reaction using $Cu(acac)_2$ (copper acetylacetonate) as Cu precursor, and dodecanthiol serving both as sulfur precursor and surfactant (details in the methods section below, absorption and X-ray diffraction are shown in FIGS. 1A-B, respectively).

Figure 2A:
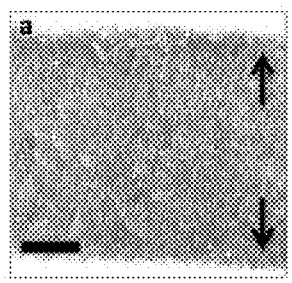
FIGS. 2A-F: $Cu_2S$ NC array thermal doping effect.
Figure 2B:
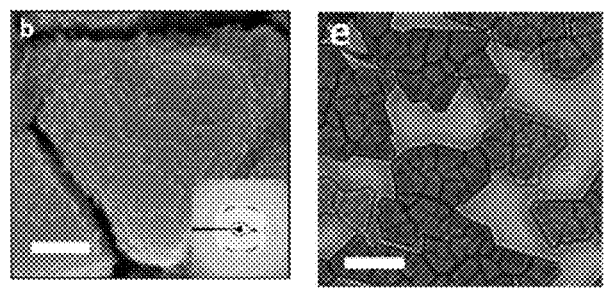
Figure 2C:
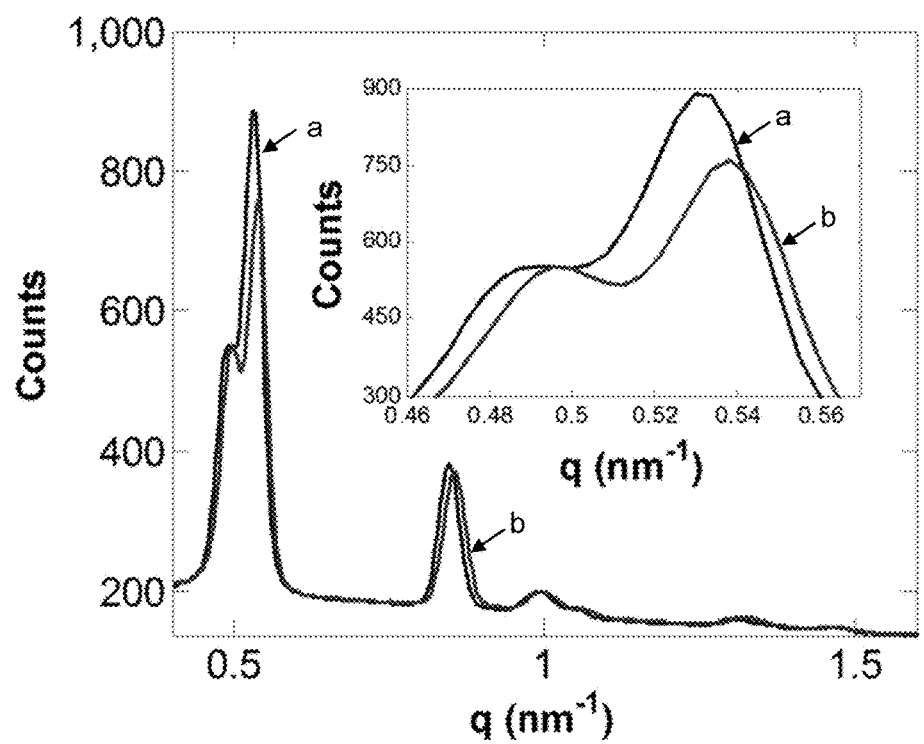

The NCs were deposited from solution using a controlled slow solvent evaporation method on $Si/SiO_2$ substrates with pre-patterned electrodes (Cr/Au, 2 µm spacing) forming ~150 nm thick films (FIG. 2A). Tuning the NCs organic ligands layer concentration enables us, through self-assembly, to achieve also highly ordered super-lattices as depicted in FIG. 2B, and verified by distinct peaks in the small-angle X-ray scattering (SAXS) data (FIG. 2C). NCs were kept under inert environment, as exposure to oxygen may also induce copper vacancies in a competing process of oxidation where a plasmon band was observed due to free carriers.

Figure 2D:
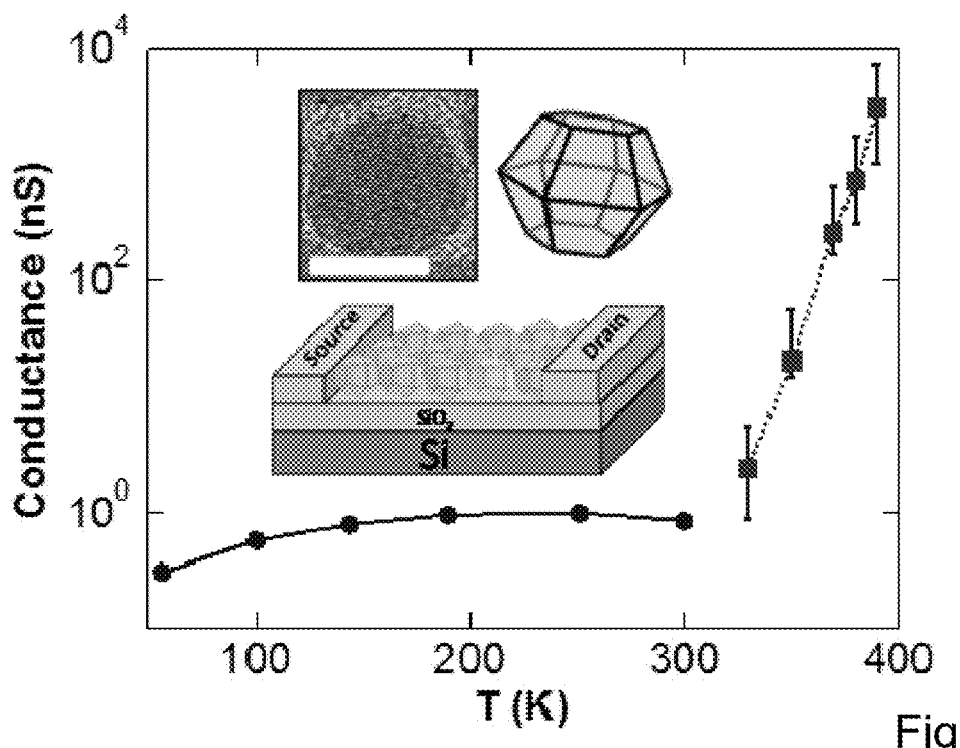
Figure 2E:
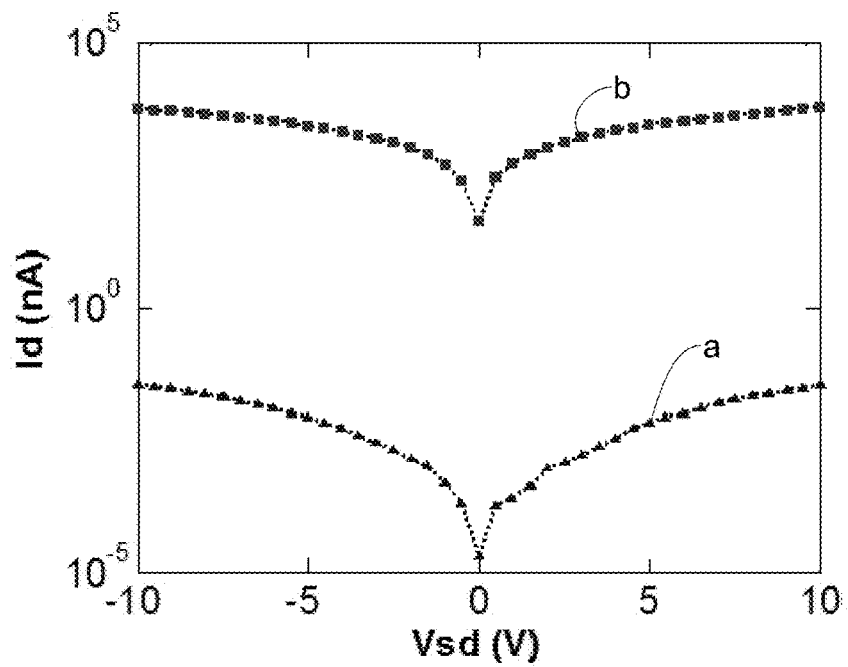
Figure 2F:
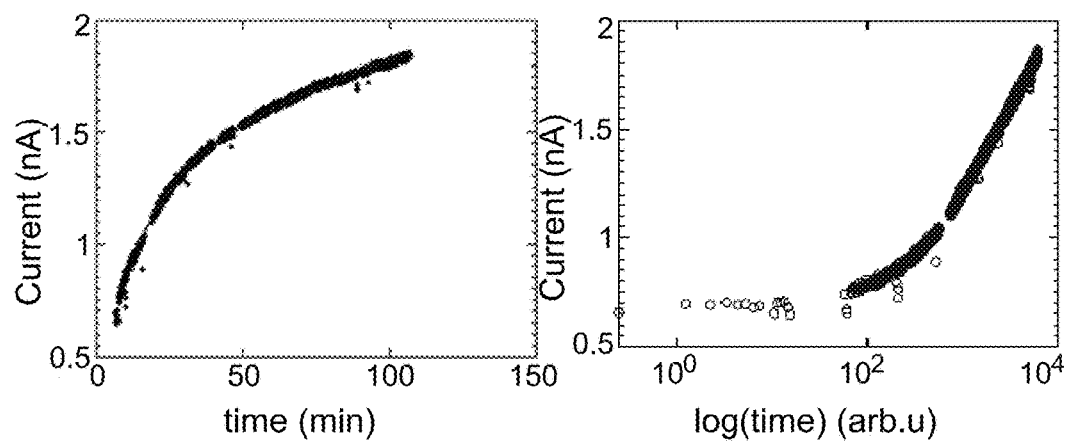

Drain-current ($I_d$) measurements were conducted under high vacuum in a variable temperature probe-station. Source-drain bias voltages ($V_{sd}$) of 1-10 V were used, yielding initially very low conductance values of ~1-10 pS at room temperature (RT). Then, to induce irreversible doping via controlled introduction of vacancies, through the thermal doping process, the film was heated in controlled manner to moderate temperatures. The film was heated and conductance (G) measurements between 340 and 400K were preformed (FIG. 2D). Remarkably, films treated at 380-400K showed 4-6 orders of magnitude increase in G. FIG. 2E depicts I-V curves demonstrating current enhancement at 10 V from 6.4 pA at 20K (curve a) to 30 µA at 380K (curve b).

Figure 3A:
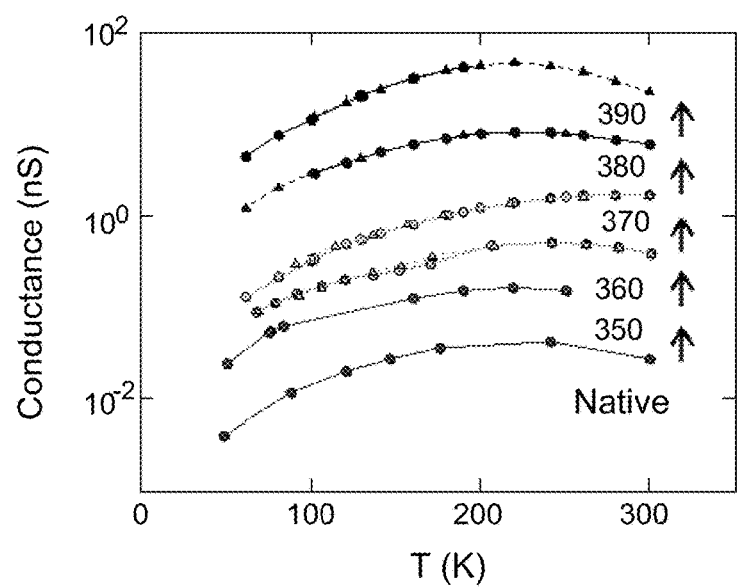
FIGS. 3A-B: Temperature dependence of conductance in the thermal doping process.
Figure 3B:
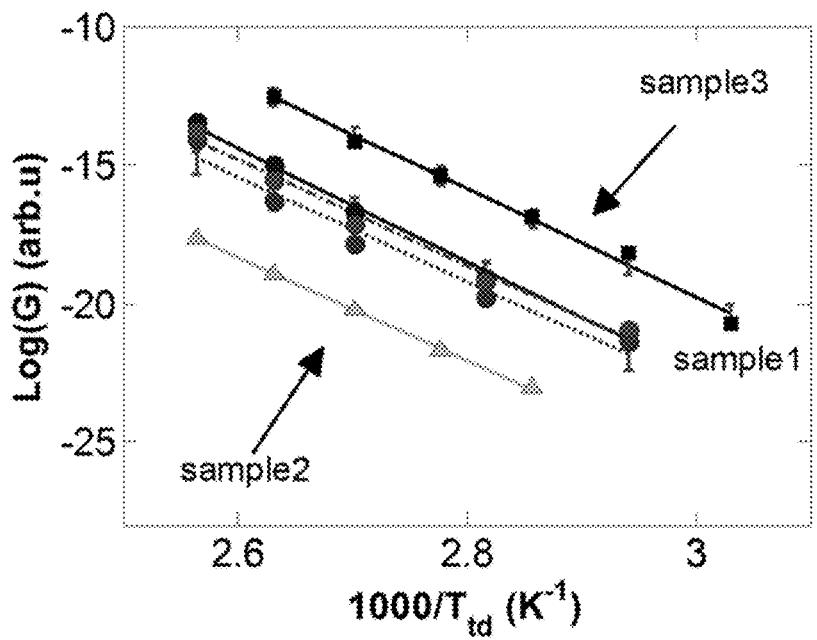

The results clearly indicate that the source for this remarkable increase of film conductance at such moderate temperatures originates from the unique thermal doping approach. The rise in film conductance is irreversible; cooling the film does not reduce G back to its original values, as depicted in FIG. 3A showing G(T) curves measured for the NC films after treatment at increasing temperatures between 350 and 390K, exhibiting exponential increase with temperature (used for the thermal doping process; thermal process temperatures are marked with arrows). FIG. 3B portrays the logarithm of conductance vs. the inverse of the treatment temperature for three different samples measured at RT and also for one sample at various measurement temperatures. All data sets exhibit Arrhenius-like dependence for the thermal process, with a common slope corresponding to an energy of ~1.6 eV.

High temperature annealing was previously applied to NC films for increasing their conductance, by removing capping organic ligands, thus reducing the inter-NC spacing. This annealing, however, was achieved at significantly higher temperatures, ~500K, typically leading to removal of capping organic ligands and reduction of inter-particle spacing by ~0.5 nm, and in some cases even to sintering.

Figure 4A:
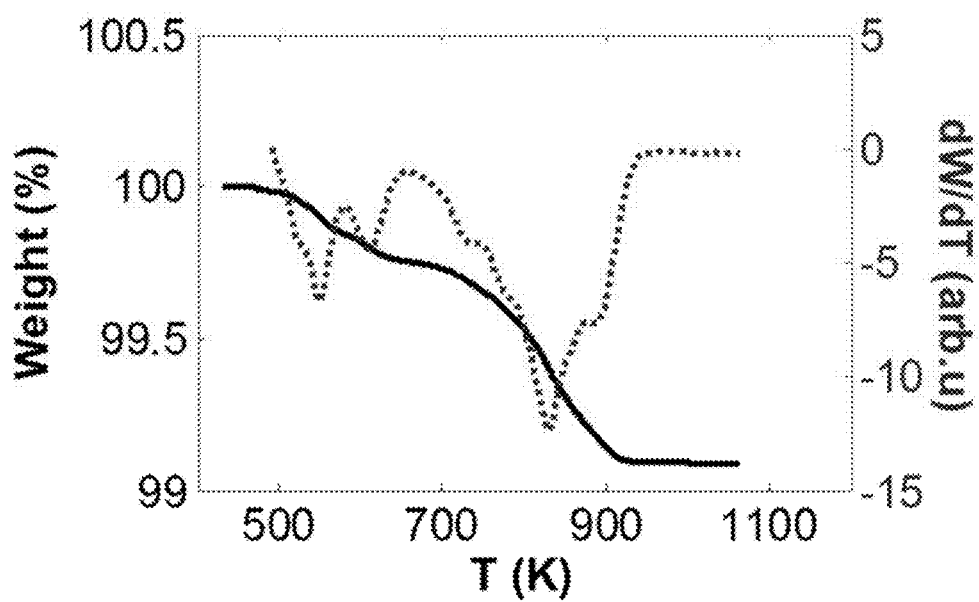
FIGS. 4A-B.
Figure 4B:
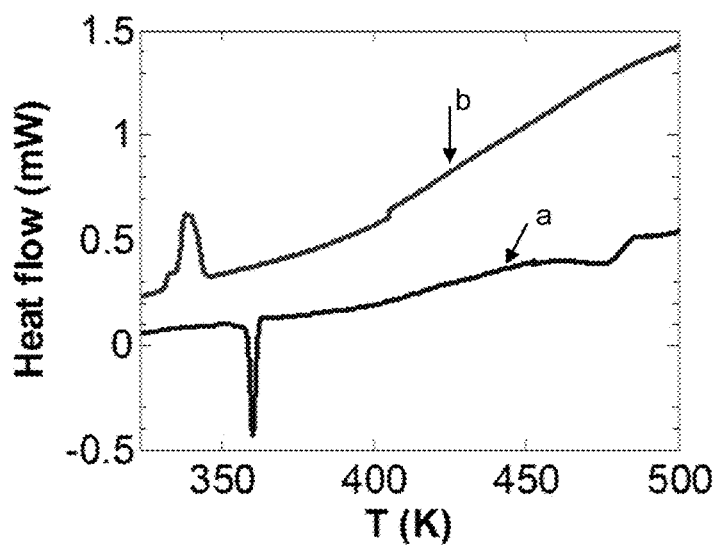
Figure 5:
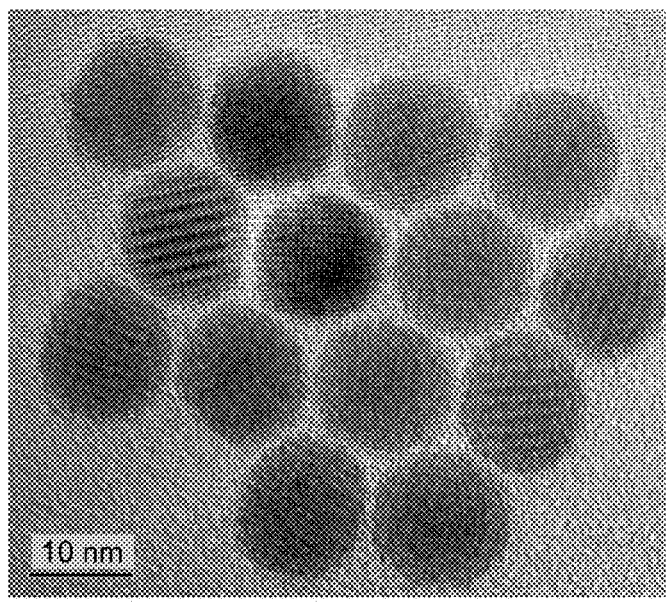
FIG. 5: High resolution transmission electron micrograph (HRTEM) depicting $Cu_2S$ NC array after the thermal doping process showing the NCs are intact with a crystalline structure. No evidence for sintering or fusing that may contribute to the inter particle charge transfer mechanism is observed. Scale bar is 10 nm.

Here, the irreversible remarkable increase in conductance occurs at moderate treatment temperatures and may originate both from an inter-NC effect, of reducing the NC separation upon heating, and an intra-NC effect leading to enhanced number of charge carriers, namely NC doping. The former effect was estimated, showing that this effect is the minor one. To directly assess the change in inter-NC spacing, SAXS was used. FIG. 2C depicts scattering intensity versus the magnitude of the reciprocal lattice vector, q, before and after the thermal treatment. SAXS measurements indeed indicate slightly reduced distances between adjacent NC, where distance of 14.78/14.64 nm between centers of adjacent NC before/after heating, were measured. The SAXS data indicate only a slight reduction by 0.14 nm in inter-NC spacing upon thermal treatment at 380K. Therefore, unlike the prior work, here the increased conductance after heating cannot be explained solely nor mainly by the decrease in inter-particle separation. This conclusion is supported by an estimate of the tunneling probability of charge carriers between adjacent NCs. When the tunneling barrier width is decreased by $\Delta d$, the inter-NC tunneling probability increases by $\propto e^{2 \cdot \kappa \cdot \Delta d}$, where in our case $\kappa^{-1}$ is 0.97 Å, similar to the tunneling decay value through saturated alkane chains (methods section below). For the measured $\Delta d$=0.14 nm, the tunneling probability increases only by a factor of ~20. Moreover, the use of relatively low temperatures does not lead to chemical changes of the ligands layer (FIG. 4). The decrease in inter-particle separation is therefore assigned to residual solvent removal accompanied by enhanced packing and reordering of the interpenetrating alkane chains on the NC surfaces. The six orders of magnitude increase in NC film conductance may also be associated to physically fusing (sintering) individual NCs into a two dimensional material [14]. In the present case rather low temperatures were used, which are insufficient for sintering. Recently, Evers et al. reported directed attachment and fusing of PbSe NCs into two dimensional materials during self assembly [15]. In this case, HRTEM and SAXS measurements of the film prior and post to the thermal doping process showed no evidence for fusing between neighboring NCs, which in the present case are coated by strongly bound dodecanethiol ligands thus NCs sintering is unlikely (FIG. 5). Therefore, the inter-NC changes upon thermal treatment can account only for a small fraction of the observed 4-6 orders of magnitude conductance enhancement.

The thermal treatment that is proposed herein is preformed at much milder temperature than the prior art for which the ligand layer is generally not removed (see SAXS). The outcomes of this process are in general of similar functionality as to the present process. The two methods could be differentiated by looking into effects that require the ligand layer intact. For example, quantum confinement effects may be diminished if ligands are removed and sintering of NCs occur. In addition the removal of the ligand layer may reactivate surface defects that were passivated by the ligands, a process that may increase the recombination rate of excitons and further degrade performance of electrical devices.

Instead of an inter-particle effect, the increased conductance after the thermal doping treatment is an intra-particle effect of doping by the creation of Cu vacancies at the moderate temperatures of the thermal doping process. This is related to the $Cu_2S$ thermodynamic tendency to form Cu vacancies leading to p-type doping. Charge carriers concentration in the $Cu_2S$ is associated to the amount of Cu vacancies, where increased number of vacancies can improve the conductance of the NC film at these moderate temperatures.

First, careful control of the thermal doping temperature enables us to tune the film conductance values as depicted in FIG. 3A. Moreover, FIG. 3B depicts the logarithm of conductance vs the inverse of the thermal doping temperature. This is depicted for three different samples (square, circle, triangle) and also at various temperatures (as indicated).

A Quantifying Parameter for Distinguishing Thermal Doping from Other Effects.

The formation of vacancies in crystals via thermal treatment has a well defined guiding formula.

$$n \propto N \cdot e^{-\epsilon_{vf}/k_B T|d},$$

where n is the number of vacant atoms sites and N is the total sites in the crystal. The "formation energy" $\epsilon_{vf}$ is a material property and $k_B$ is the Boltzmann constant.

In materials for which the vacancies are directly associated to the charge carrier concentration, one can monitor the vacancy formation through the increase in conductance and verify the above law. Formation energy of 1-2 eV is reasonable while much smaller formation energies are probably associated with activation of inner or other conductance levels.

The linear relation follows Arrhenius activation dependence for the introduced thermal doping process that allows extracting the activation energy for Cu vacancies formation to be ~1.6 eV per vacancy.

Figure 6A:
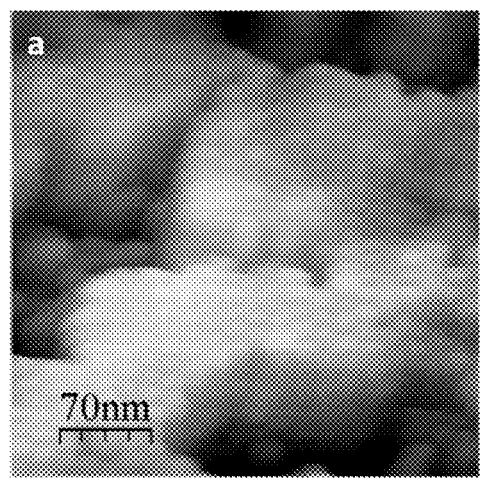
FIGS. 6A-C.
Figure 6B:
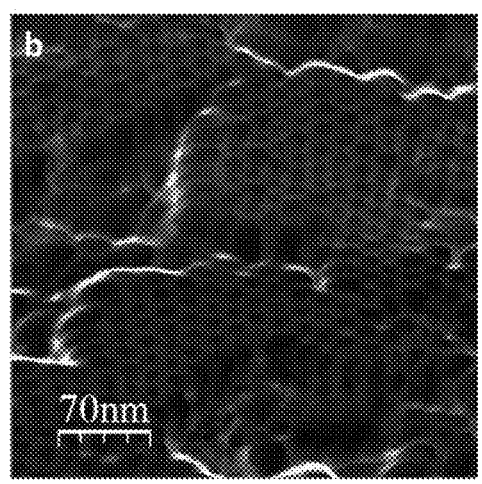
Figure 6C:
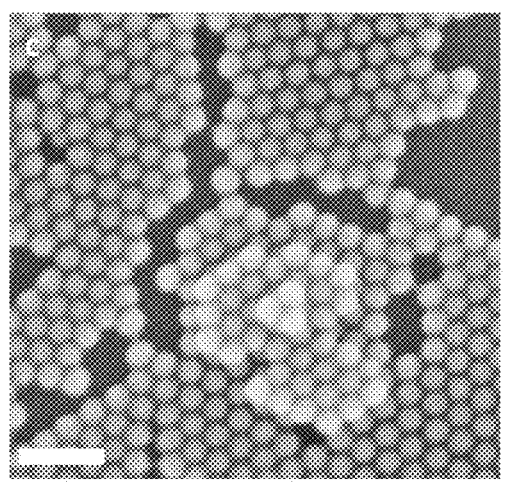
Figure 7A:
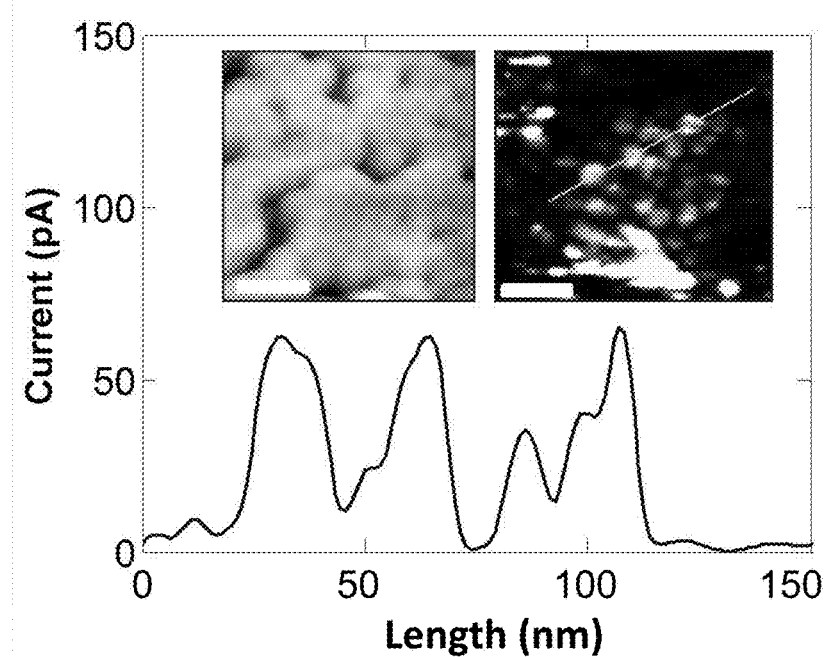
Figure 7B:
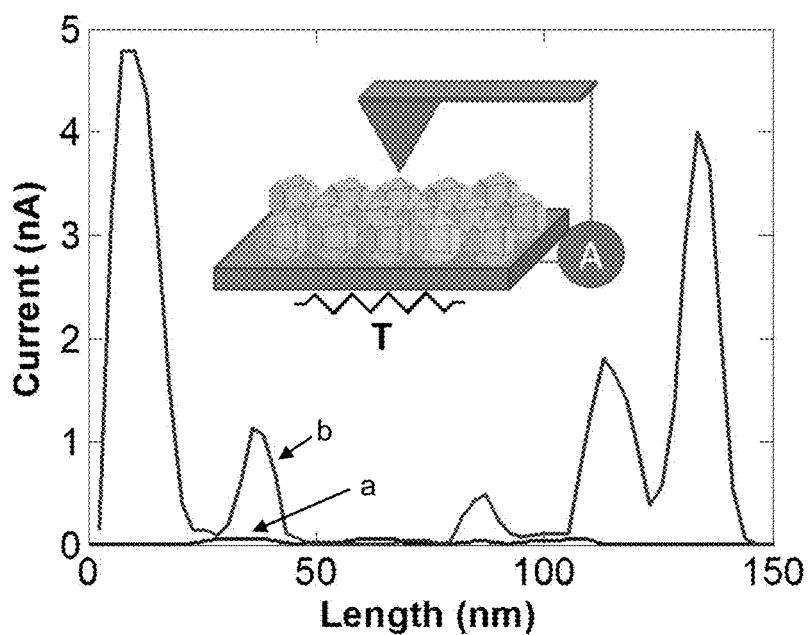
Figure 7C:
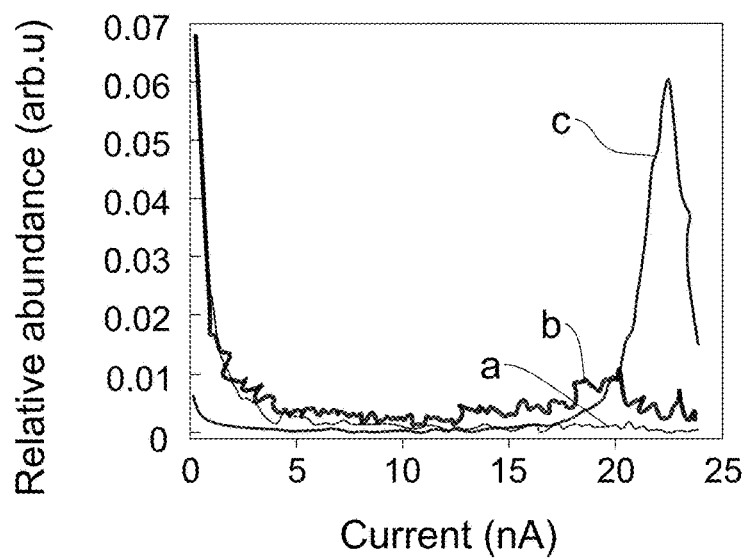

Next the contribution of intra-particle effects to the remarkable increase in conductance upon thermal treatment of the NC films was considered. To this end, a study of the electronic properties at the single particle level was conducted by local probe measurements using both conductance atomic force microscopy (C-AFM) and scanning tunneling microscopy (STM). Local conductance of single NCs were measured via C-AFM while applying 3 V bias between the conducting tip and a gold surface on which NCs were deposited, yielding self-assembled NC monolayers (FIGS. 6,7). FIG. 7A exhibits a topography and current map of a typical array. Cross-sectional analysis of the current map reveals approximately two orders of magnitude increase in the single NC conductance before and after the thermal treatment (FIG. 7B). Statistical analyses for hundreds of thermally treated single NCs corroborates these results (FIG. 7C). The increase of conductance at the single NC level further shows that the thermal doping process induces Cu vacancies, and modifies the NCs inherent electronic properties, realizing a doping effect, as in the $Cu_2S$ NC array. The significant increase of conductance at the single NC level shows that the thermal treatment process induces an intra-particle modification leading to the introduction of charge carriers.

Figure 7D:
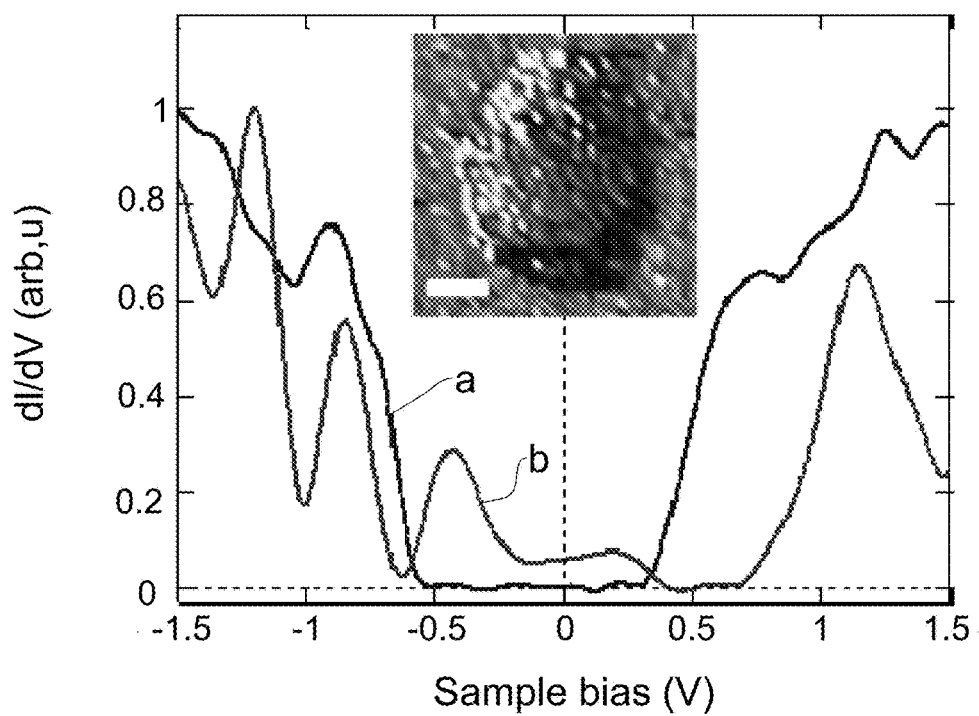

For further understanding of these intra-particle changes, STM and STS were used. Dilute samples of $Cu_2S$ NCs were deposited on atomically flat Au surfaces, where isolated NC can be measured. The STM tip was positioned above a single $Cu_2S$ NC realizing a double barrier tunnel junction configuration, and I-V spectra were acquired. FIG. 7D portrays typical dI/dV-V tunneling spectra, measured at 4.2K before (curve a) and after (curve b) thermal treatment. The dI/dV-V spectra are proportional to the local density of states. The spectrum for pre-thermal treated NCs depicts typical semiconductor density of states with a clear band-gap. After the thermal treatment, a finite density of states inside the band gap is identified. Most notably, a distinct offset of the band-edges toward higher energies is observed. This offset is demonstrated by statistical analysis of the band-edge shifts (FIG. 7E; FIG. 7F shows additional STS curves), where in the thermal treated NCs (grey bars), a statistically significant increase of the band offsets towards positive values is evident, compared with the pre-treated NCs (black bars). This analysis indicates a shift of the Fermi energy towards the valence band, akin to p-doped semiconductors. This result further corroborates the formation of vacancies via thermal doping, which are associated to the hole conduction in the NC. These aforementioned AFM and STM results corroborate the intra-particle electronic change due to the thermal doping treatment leading to p-type doping in this case.

p-type behavior of $Cu_2S$ is known in the bulk and attributed to Cu vacancies, which form due to the low chemical potential of Cu(0). This behavior results in a series of Cu depleted substances with a rich phase diagram, for example, the near stochiometric Djurleite phase ($Cu_{1.96}S$), resulting in free hole charge carriers. In bulk $Cu_2S$ thin films, thermal annealing at 430K increased the film conductance only by a factor of two. The vacancy formation is therefore significantly enhanced in $Cu_2S$ NCs due to facile diffusion of Cu atoms to the surface. Given the significant change in conductance and the related p-type behavior induced after the thermal treatment, the process was coined "thermal doping".

A simplified model was conjectured for the hole conductance G in the $Cu_2S$ NCs array and its dependence on the thermal doping temperature $T_{td}$, $$G(T_{td}) \propto e^{-\epsilon_{vf}/k_B T_{td}} \cdot e^{-2\kappa d(T_{td})}, \quad (1)$$

where the first exponential expression represents the intra-particle term of copper vacancies formation with a "formation energy" $\epsilon_{vf}$ ($k_B$ is the Boltzmann constant). The second term is the aforementioned inter-particle probability for electron tunneling between neighboring NCs, which contributes to increased conductance upon the thermal treatment by only a factor of ~20, and therefore can be neglected leading to the approximate dependence $$\frac{d\ln G}{d(1/T_{td})} \cong -\frac{\epsilon_{vf}}{k_B}. \quad (2)$$

This relation is indeed fully consistent with the observed Arrhenius-like activation in FIG. 3B, allowing to derive the Cu vacancy formation energy, $\epsilon_{vf}$~1.6 eV. Using this value, an increase by a factor of ~$5 \times 10^4$ was estimated in the hole density following the thermal doping process at 380K, compared with the as-prepared NC array. This increase translates to a ~280 meV shift of the Fermi energy towards the valence band, similar to the values observed in the STS measurements on single NCs (see the methods section below).

$Cu_2S$ NCs were synthesized in a method that yielded minimal or no copper vacancy content and were highly stoichiometric, as supported by the lack of optical surface plasmon (FIG. 1B) and by variable temperature powder XRD measurements (FIG. 1A). The XRD data is consistent with Cu depletion from the initial stoichiometric $Cu_2S$ low chalcocite phase, towards a Cu depleted phase. In a conservative estimate of a single vacancy (hole) per 1000 as synthesized NCs, and assuming a free electron model with linear relation between conductance and vacancy (charge carrier) concentration, ~50 vacancies (holes) were estimated per a 14 nm thermally doped NC.

Figure 8A:
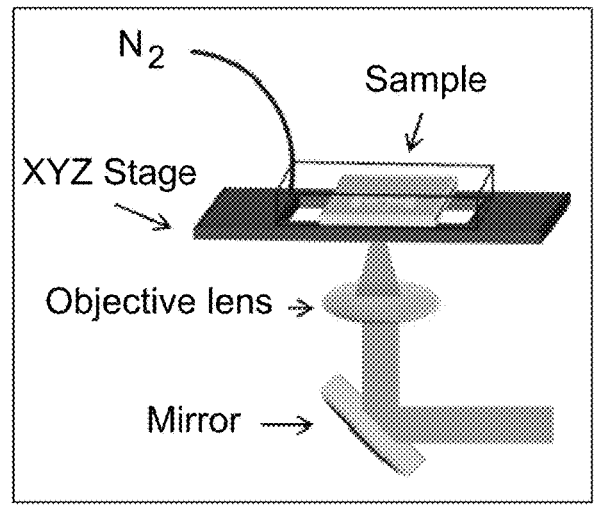
FIGS. 8A-C.
Figure 8B:
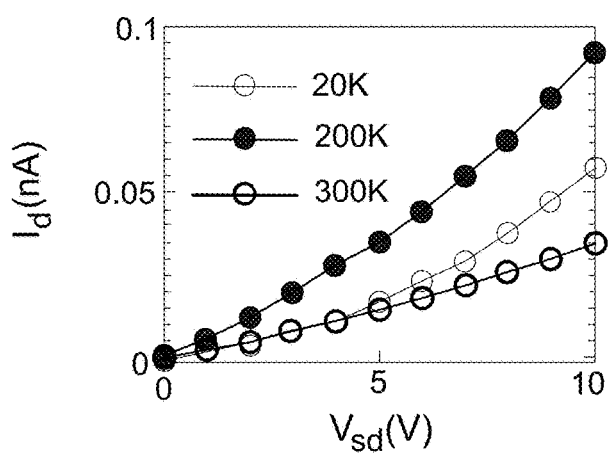
Figure 8C:
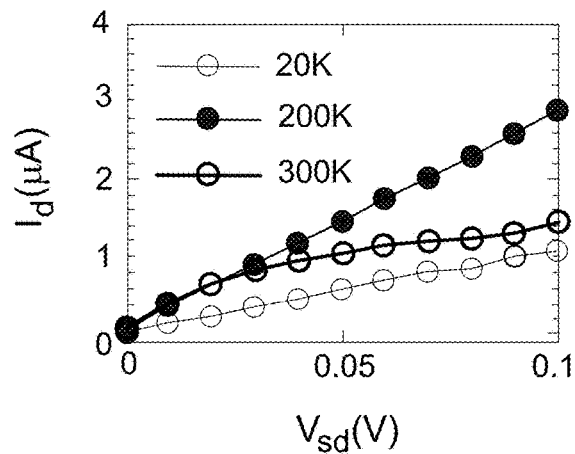
Figure 9B:
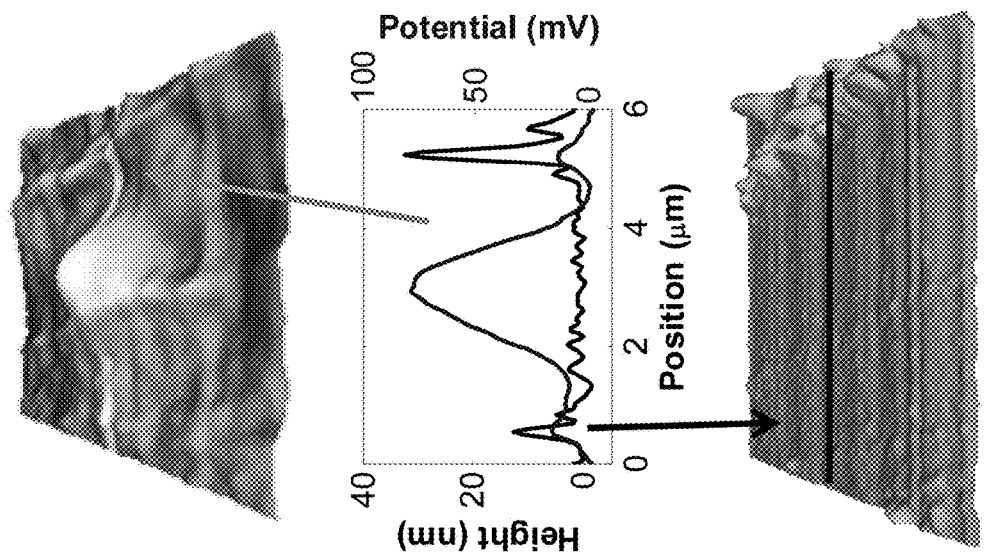
FIGS. 9A-C: Optical local thermal doping.
Figure 9A:
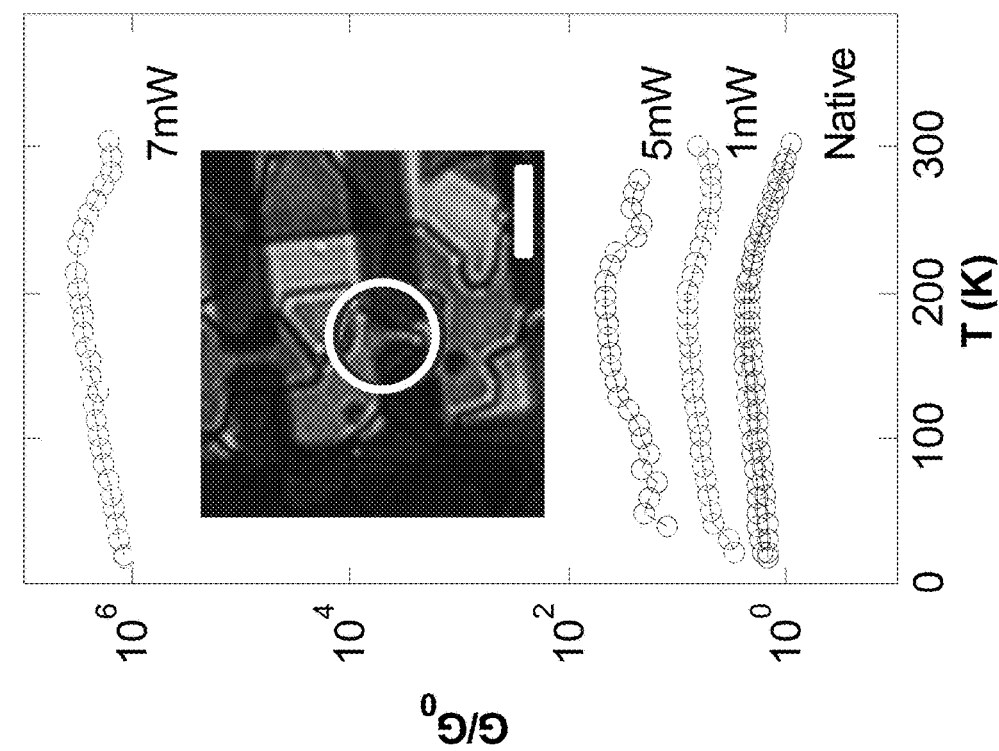

Thermal doping of semiconductor NC films has diverse applications in bottom-up solution based preparation of electronic devices. Moreover, the ability to locally dope specific regions of the film while maintaining different conductance nearby, may serve as a patterning method for profile doping. Local Cu vacancy formation was implemented via thermal doping by using a focused laser as the heat source (FIGS. 8, 9A). At lower laser powers (1-5 mW) conductance increased by an order of magnitude. Remarkably, after exposure to a laser power of 7 mW, the film conductance increased by 6 orders of magnitude, similar to the thermal doping process induced by heating which was discussed above. This demonstrates that local thermal doping is readily possible via laser irradiation. After exposure to laser intensity of ~$2 \cdot 10^5$ W/$cm^2$, the film conductance irreversibly increased by 6 orders of magnitude, similar to the thermal doping process discussed above.

Figure 9C:
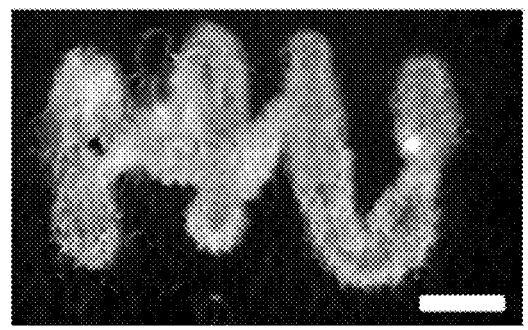

To further characterize the laser induced thermal doping process, NC arrays were assembled on and indium-tin-oxide (ITO) film. AFM was equipped with inline optics which enabled correlation of the AFM scan with the optical axis used for laser illumination. The samples were thermally heated via laser illumination (10 mW, 532 nm) after which the illuminated area was characterized with the AFM. Both topography and Kelvin probe microscopy (KPM) data were measured using a dual pass technique (more details are provided in the methods section of the supporting information). FIG. 9B top, 9B bottom depict 3D maps of the potential and topography of the thermally doped area. The line cross-section taken along the potential map (FIG. 9B top) presented in FIG. 9B middle depicts a ~80 mV change in the potential of the heated NC array (curve a), while no change can be detected in the corresponding topography scan (curve b). The increase of the surface potential in the illuminated region is consistent with p-type doping and the concomitant increase of hole concentration in the NCs at this region. KPM data thus indicate that also in the case of laser annealing the conductance enhancement is predominantly due to intra-particle p-doping. Finally using a controlled movement of the sample stage patterned doping was generated, and characterized with the KPM technique, as portrayed in FIG. 9C. This demonstrates the feasibility of local thermal doping via laser irradiation.

The use of aperture and aperture-less near-field microscopy allows achieving high resolution doping profiles even down to 20-50 nm scale. For example, this enables specific patterning of a line of NCs within an array which is a highly challenging task.

In addition, local doping of the NC film is demonstrated via the use of a focused laser beam, serving as the heating source. This approach may be used in order to fabricate NC based electronic and optoelectronic devices by using a laser beam to pattern locally the film's doping profile and hence, for example, conductance properties. Thermal doping of NC films leading to vacancy formation is of importance for the bottom-up fabrication and function of diverse electronic and optoelectronic devices such as transistors, solar cells and light emitting diodes in which electrical properties of deposited NC films are typically much less controllable than in the traditionally fabricated electronic devices. Furthermore, the exceptional low temperatures needed for the thermal doping leading to vacancy formation in $Cu_2S$ may further benefit printed plastic electronics on flexible substrates which are incompatible with higher process temperatures. Moreover, in additional embodiments, thermal doping is expanded by following the thermal doping process with a step of reacting the thermal doped NC with other materials to insert impurities into the NCs. For example with impurities that would lead to n-type behavior.

$Cu_2S$ is a binary copper chalcogenide, and is a mother compound for a family of other semiconductors, for example $CuInS_2$, $CuCaF_2$, $CuInSe_2$ and $CuInGaSe_2$. These developments open the path to fabrication of diverse electronic, optoelectronic and solar cell devices using the thermal doping approach, which is also applicable for these materials.

Methods

Materials:

$Cu(acac)_2$ (99.99%), dodecanethiol (≥98%), hexamethyldisilazane (99.9%), chloroform (Anhydrous 99%), and methanol (Anhydrous 99.8%) were purchased from Sigma Aldrich.

Si wafers were purchased from Virginia semiconductor inc.

Synthesis of $Cu_2S$ NCs:

$Cu_2S$ NCs, were synthesized following the procedure described in Ref (1). Briefly, $Cu_2S$ seeds are formed by the decomposition of $Cu(acac)_2$ in excess dodecanethiol under inert atmosphere at 200° C. The dodecanethiol acts as the solvent, surfactant and particularly as the sulfur source. The crude seed solution is washed repeatedly with chloroform and the purified precipitate is kept in the glove box. The washing process depletes the amount of the dodecanthiol ligands on the NC surfaces enhancing the natural tendency of these NCs to self assemble into ordered superlattices.

Device Fabrication:

Au/Cr electrodes were patterned using standard optical lithography methods onto highly p-doped $SiO_2$/Si substrates (thermal oxide 100 nm) and also on glass substrates for the optical thermal doping process. Cr (2 nm adhesion layer) and Au (100 nm) electrodes were then thermally evaporated. Multiple electrode separations were tested. Typical distances between electrodes of 1.8 μm (L/W ratios of 10-100) gave the best results. Prior to the $Cu_2S$ NC deposition, the substrates were cleaned with piranha solution and treated with hexamethyldisilazane molecules to increase surface hydrophobicity. Tight size distribution of the NCs and careful control over the ligands coverage on the NCs surface were important parameters in the self assembly process. Excessive cleaning of the organic protective layer (typically four washing sequences with chloroform), resulted in colloidally unstable NCs with tendency to aggregate and precipitate, due to NC surface ligand depletion, although the solution could be redispersed by long sonication treatment. A more subtle cleaning method with isopropanol (IPA) led to a stable solution in which the NCs dispersion was stable, due to higher concentration of organic ligands.

NCs deposition was performed at room temperature and under inert atmosphere, with the ability to tune the evaporation rate of the solvent (typically ~10 micron/min) to achieve slow deposition of the NCs for better coverage and ordering. Substrates were placed in a vial vertically to its flat bottom. The vial was then filled with NC solution and the solvent was left to slowly evaporate. The resulting film was washed with IPA and characterized using HRTEM, XHR-SEM (Magellan) AFM and SAXS. NC deposition from the chloroform cleaned solution resulted in dense arrays with low order (FIG. 2A), while deposition of the NCs from the IPA cleaned solution resulted in highly ordered superlattices (FIG. 2A).

Electrical Characterization:

Electrical measurements on NCs films were conducted using a closed cycle cryogenic probe station (Advanced Research Systems inc.). The measurements were performed in high-vacuum conditions (~$10^{-4}$ mbar) and in well controlled (sample) temperatures ranging between 20 and 400K. Source drain voltages of 1-10 V were applied by a voltage source (Keithly model 2400). Drain current was amplified by a current amplifier (DL Instruments 1211) and measured with a digital multimeter (Keithly model 2100). Sample temperature was controlled by a Lakeshore 340 controller.

Conductive-AFM Measurements:

The NCs solutions were drop cast from dilute solution onto a flame-annealed Au(111) substrate and let dry, resulting in a monolayer of $Cu_2S$ films. The samples were then promptly inserted into a (Solver P-47 NTMDT) AFM in $N_2$ rich environment. Measurements were conducted in contact mode using TiPt coated Si tips (csc38/Ti—Pt μmasch) with typical force constants of 0.03 N/m. High set-point values and slow tip-sample approach parameters were used in order to keep the $Cu_2S$ array intact under the contact mode measurement conditions. Scan rate of 1 Hz and tip bias of 3 V were used. Topography and current measurements were acquired simultaneously. The thermal doping procedure was conducted inside the AFM chamber under inert environment using a temperature controlled heated sample holder.

STM and STS Measurements:

For STM measurements, the NCs solutions were drop cast from an ultra dilute solution onto a flame annealed Au(111) substrate and let dry. The samples were promptly inserted into a homemade low temperature STM with RHK control electronics, where isolated single $Cu_2S$ NC could be measured. The STM measurements were performed at 4.2K, using Pt—Ir tips, in He exchange gas. Tunneling I-V characteristics were acquired after positioning the STM tip above individual NCs, realizing a double barrier tunnel junction (DBTJ) configuration, and disabling momentarily the feedback loop. The dI/dV-V tunneling spectra, proportional to the local DOS, were numerically derived from the measured I-V curves. The topographic images were acquired with current and sample-bias set values of I≅0.1 nA and V≅1 V. Thermal doping procedure was conducted outside the STM under the same conditions as was performed for the conductance measurements. 9 and 14 different single $Cu_2S$ NCs were measured before/after the thermal doping process, respectively.

Small Angle x-Ray Scattering (SAXS):

NCs were deposited inside a 1.5 mm quartz capillary tube via the slow evaporation method discussed above. SAXS measurements were performed using an in-house setup described elsewhere. The pre-doped samples were measured and then promptly inserted into a temperature controlled probe station and thermally treated in the same manner the electronic samples were treated.

Local Thermal Doping Process Via Laser Irradiation:

$Cu_2S$ NC films were deposited on glass substrates with pre-patterned electrodes (see above). The samples were electronically characterized, placed in inert environment and illuminated with 532 nm laser which was focused using 20× objective (Nikon-CFI Plan Fluor 20×, NA 0.5), to yield intensities of ~$2 \cdot 10^5$ W/cm² for thermally doping the NCs. The sample stage was horizontally scanned using a JPK NanoWizard3 with TAO scanning stage during the optical irradiation to homogenize the heating effects along the illuminated gap. The sample was then inserted back to the probe-station for further electrical characterization.

Wavefunction Decay Coefficient

To estimate the conductance increase due to decrease in inter-NC distance between adjacent particles, we solve a simplified one dimensional square well potential tunneling problem. A barrier height, ϕ, of 5 eV was estimated for the alkyl chains, and a $Cu_2S$ hole effective mass, $m_h$, of 0.8 $m_e$, where $m_e$ is the free electron mass. κ, the wavefunction decay constant, was calculated as follows, $$\kappa = \frac{\sqrt{2m_h\phi}}{\hbar} = 10.24 \text{ nm}^{-1} \quad (1)$$

$$\kappa^{-1} = 0.097 \text{ nm} \quad (2)$$

with this value of κ⁻¹ we next estimate the ratio of the hole tunneling probability, $$\frac{\beta}{\beta_0},$$

where $\beta_0$ and $\beta$ are the hole tunneling probabilities between adjacent NC before and after the thermal doping process, respectively $$\frac{\beta}{\beta_0} = \exp(2 \cdot \kappa^* \Delta d) = 17.6 \quad (3)$$

Where Δd is the inter NC separation length change, extracted from the SAXS measurements (Δd=0.14 nm). Therefore, the inter-NC contribution is estimated to increase the conductance only by a factor of ~20.

Non Monotonic Temperature Dependence of the Conductance Between 20 and 300K

A less pronounced, yet intriguing effect, is the non-monotonic temperature dependence of the conductance observed at temperatures between 20 and 300K, (FIG. 2A), exhibiting a slight local maximum of the film conductance at around 200K. Such behavior was observed for all $Cu_2S$ NC films studied, where the peak position varied between 175 to 210K. The G(T) curves are always reversible in this temperature range, with no hysteresis effect when repeated cooling and heating cycles are conducted, which differentiates it from the Cu vacancy thermal-doping process at elevated temperatures. The origin of this behavior is not completely clear, but may be associated with a change in the density of states observed in $Cu_2S$ thin films at around 175K. This change manifests itself by a change in the (activated) conductance dependence on temperature, becoming larger, namely, involving higher activation energy, above 175K. This corresponds to reduced density of states contributing to the thermal activated conductance in the films above ~175K. This reduction in density of states is expected to decrease the density of available states for inter-particle tunneling or hopping in the NC films, resulting in a (local) reduction of the conductance at this temperature range.

Calculation of the Fermi Energy Shift

The extracted value of the Cu vacancy formation energy, $\epsilon_{vf}$~1.6 eV, was used to estimate the increase in carrier density and hence the Fermi energy shift. The formation of vacancies in a crystal obeys the following formula:

$$n \cong N \cdot \exp\left(-\frac{\varepsilon_{vf}}{k_B T_{td}}\right), \quad (4)$$

where n is the number of vacancies in the crystal, N is the total number of atoms in the crystal, $\epsilon_{vf}$ is the energy required to remove an atom from a lattice site, $k_B$ is the Boltzmann constant and $T_{td}$ is the thermal doping temperature. A ratio of ~$5 \cdot 10^4$ increase was calculated in vacancies in the thermally treated NCs over the as synthesized NCs. In this calculation the contribution of matrix compression was taken into consideration, which contributes a factor of about 20 to the increase in conductance.

The value of relative increase in charge carriers was used to estimate the Fermi energy shift using the expression:

$$p_v = n_i \exp\left(\frac{\mu_i - \mu}{k_B T}\right), \quad (5)$$

where $p_v/n_i$ is the ratio of concentration of holes after thermal doping compared with the as prepared NC array in the valance band (~$5 \cdot 10^4$), and $\mu_i$-$\mu$ is the energy shift in chemical potential between the doped and intrinsic case, getting a value of 280 meV. This shift is similar to values observed by us in the STS on single NCs.

The invention claimed is:

1. A method for vacancy doping of a nanoparticle material, the method comprising:
   treating a nanoparticle material, under oxygen-free conditions, and at a temperature below 380K, said temperature being selected to permit formation of vacancies within the nanoparticle material, while avoiding fusion of said nanoparticles.

2. The method according to claim 1, the method being performed such that at least one electrical property of a nanoparticle material is amplified or attenuated.

3. The method according to claim 2, wherein the electrical property is selected from free charge carriers, conductance, impedance, resistance, voltage, current, potential and polarization.

4. The method according to claim 1, wherein vacancy doping amplifies conductance of the nanoparticle material.

5. The method according to claim 1, wherein the number of vacancies per nanoparticle is between 1 to 1,000 vacancies per nanoparticle.

6. The method according to claim 1, wherein the number of vacancies ranges from 0.001% to 20%, 0.01% to 20%, 0.1% to 20% or 1% to 20% of the number of lattice sites in the nanoparticle.

7. The method according to claim 1, wherein vacancies are achievable by laser beam radiation, the laser beam being selected to have a beam wavelength corresponding to the wavelength range of the absorption spectra of the nanoparticle material.

8. The method according to claim 1, further comprising a step of forming an array or a pattern of nanoparticles prior to or after vacancy doping.

9. The method according to claim 8, comprising:
obtaining the nanoparticles array; and
thermally treating said nanoparticles array so as to cause vacancy doping.

10. The method according to claim 9, wherein the thermal treatment is achieved by laser induced heating.

11. The method according to claim 10, wherein the method forms a pattern of vacancy doped nanoparticles in the nanoparticles array.

12. The method according to claim 11, wherein the pattern is conductive.

13. The method according to claim 11, wherein the pattern is formed on an electronic device.

14. The method according to claim 1, further comprising a step of doping a vacancy doped nanoparticle with at least one foreign atom.

15. The method according to claim 14, wherein the foreign atom is Li or Mg or Na or K or Rb or Cs or Be or Ca or Sr or Ba or Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or any combination thereof.

16. The method according to claim 1, wherein the nanoparticle is a colloidal nanoparticle of at least one material selected from metal, insulator, and a semiconductor material.

* * * * *